(12) United States Patent
Lee et al.

(10) Patent No.: US 10,964,901 B2
(45) Date of Patent: Mar. 30, 2021

(54) ORGANIC LIGHT-EMITTING DISPLAY DEVICE

(71) Applicant: SAMSUNG DISPLAY CO., LTD., Yongin-si (KR)

(72) Inventors: Joongu Lee, Yongin-si (KR); Jaesik Kim, Yongin-si (KR); Jaeik Kim, Yongin-si (KR); Yeonhwa Lee, Yongin-si (KR); Sehoon Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/577,299

(22) Filed: Sep. 20, 2019

(65) Prior Publication Data

US 2020/0144529 A1    May 7, 2020

(30) Foreign Application Priority Data

Nov. 7, 2018    (KR) .......................... 10-2018-0136035

(51) Int. Cl.
| | | |
|---|---|---|
| *H01L 51/50* | (2006.01) | |
| *H01L 27/32* | (2006.01) | |
| *H01L 51/56* | (2006.01) | |
| *H01L 51/52* | (2006.01) | |

(52) U.S. Cl.
CPC ...... *H01L 51/5008* (2013.01); *H01L 27/3244* (2013.01); *H01L 51/5203* (2013.01); *H01L 51/524* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 9,153,797 B2 | 10/2015 | Kim et al. | |
| 10,002,910 B2 | 6/2018 | Oh et al. | |
| 10,147,775 B2 | 12/2018 | Kim et al. | |
| 2014/0183479 A1* | 7/2014 | Park | H01L 27/3218 |
| | | | 257/40 |
| 2016/0172634 A1* | 6/2016 | Kim | H01L 51/5228 |
| | | | 257/40 |
| 2017/0005150 A1 | 1/2017 | Yeo et al. | |
| 2017/0365812 A1 | 12/2017 | Choung et al. | |
| 2018/0261797 A1* | 9/2018 | Lee | H01L 51/5056 |

(Continued)

FOREIGN PATENT DOCUMENTS

| | | |
|---|---|---|
| KR | 10-2014-0082089 | 7/2014 |
| KR | 10-2017-0003458 | 1/2017 |
| KR | 10-2017-0052766 | 5/2017 |

(Continued)

*Primary Examiner* — Dung A. Le
(74) *Attorney, Agent, or Firm* — F. Chau & Associates, LLC

(57) ABSTRACT

An organic light-emitting display device includes: a substrate; a pixel electrode on the substrate; an auxiliary electrode spaced apart from the pixel electrode; a first insulating film between the pixel electrode and the auxiliary electrode and covering an end of the pixel electrode and an end of the auxiliary electrode; an intermediate layer on the pixel electrode and including an emission layer; an opposite electrode covering the intermediate layer and contacting the auxiliary electrode; and a passivation layer covering the opposite electrode.

19 Claims, 16 Drawing Sheets

(56) References Cited

U.S. PATENT DOCUMENTS

2019/0013494 A1* 1/2019 Hanari ................ H01L 51/5243
2019/0088730 A1* 3/2019 Lee ..................... H01L 27/3253

FOREIGN PATENT DOCUMENTS

| KR | 10-2017-0062596 | 6/2017 |
| KR | 10-1779475 | 9/2017 |
| KR | 10-2017-0142231 | 12/2017 |

* cited by examiner

ORGANIC LIGHT-EMITTING DISPLAY DEVICE

CROSS-REFERENCE TO RELATED APPLICATION

This application claims priority under 35 U.S.C. § 119 to Korean Patent Application No. 10-2018-0136035, filed on Nov. 7, 2018, in the Korean Intellectual Property Office, the disclosure of which is incorporated by reference herein in its entirety.

TECHNICAL FIELD

The present inventive concept relates to an organic light-emitting display device and a method of manufacturing the same.

DESCRIPTION OF THE RELATED ART

An organic light-emitting display device is a self-luminescent display device that includes an organic light-emitting device having a hole-injecting electrode, an electron-injecting electrode, and an organic emission layer formed between the hole-injecting electrode and the electron-injecting electrode. The organic light-emitting device emits light as excitons, which are generated as holes injected by the hole-injecting electrode and electrons injected by the electron-injecting electrode are combined with each other at the organic emission layer, are transited from an excited state to a ground state.

Although a fine metal mask (FMM) is used for depositing the organic emission layer on a substrate, the FMM can increase manufacturing cost.

SUMMARY

According to an exemplary embodiment of the present inventive concept, an organic light-emitting display device includes: a substrate; a pixel electrode on the substrate; an auxiliary electrode spaced apart from the pixel electrode; a first insulating film between the pixel electrode and the auxiliary electrode and covering an end of the pixel electrode and an end of the auxiliary electrode; an intermediate layer on the pixel electrode and including an emission layer; an opposite electrode covering the intermediate layer and contacting the auxiliary electrode; and a passivation layer covering the opposite electrode.

The auxiliary electrode may surround the pixel electrode.

The auxiliary electrode may include the same material as the pixel electrode.

The first insulating film may surround the pixel electrode.

The intermediate layer may further include a hole injection layer, a hole transport layer, an electron transport layer, or an electron injection layer.

An end of the opposite electrode may be in contact with an upper surface of the auxiliary electrode.

An end of the passivation layer may contact an upper surface of the auxiliary electrode.

The passivation layer may be island-shaped.

The passivation layer may include oxide, oxynitride, or nitride.

The organic light-emitting display device may further include: a sealing member on the passivation layer, the sealing member including an organic layer and an inorganic layer.

The organic light-emitting display device may further include: a second insulating film between the auxiliary electrode and the substrate.

The auxiliary electrode and the first insulating film may be on the second insulating film.

The end of the pixel electrode may be on the second insulating film.

The first insulating film may surround the pixel electrode on the second insulating film.

According to an exemplary embodiment of the present inventive concept, an organic light-emitting display device includes: a substrate; first and second pixel electrodes on the substrate; an auxiliary electrode, which surrounds the first and second pixel electrodes, wherein the auxiliary electrode is spaced apart from the first and second pixel electrodes; a first insulating film between the first pixel electrode and the auxiliary electrode and covering an end of the first pixel electrode and a first end of the auxiliary electrode; a second insulating film arranged between the second pixel electrode and the auxiliary electrode and covering an end of the second pixel electrode and a second end of the auxiliary electrode; a first intermediate layer including a first emission layer and arranged on the first pixel electrode; a second intermediate layer including a second emission layer and arranged on the second pixel electrode; a first opposite electrode covering the first intermediate layer and contacting the auxiliary electrode; a second opposite electrode covering the second intermediate layer and contacting the auxiliary electrode; a first passivation layer covering the first opposite electrode; and a second passivation layer covering the second opposite electrode.

The first and second pixel electrodes may include the same material as the auxiliary electrode.

The first and second insulating films may respectively surround the first and second pixel electrodes.

The organic light-emitting display device may further include: a third insulating film between the first and second pixel electrodes and the substrate.

The first and second pixel electrodes may be on the third insulating film.

The organic light-emitting display device may further include: a sealing member arranged on the first passivation layer and the second passivation layer and including an organic layer and an inorganic layer.

According to an exemplary embodiment of the present inventive concept, a method of manufacturing an organic light-emitting display device includes: simultaneously forming a pixel electrode and an auxiliary electrode on a substrate; forming a first insulating film between the pixel electrode and the auxiliary electrode to cover an end of the pixel electrode and an end of the auxiliary electrode; sequentially forming a lift-off layer and a photoresist on the pixel electrode, the auxiliary electrode, and the first insulating film; forming an opening exposing an upper surface of the pixel electrode by patterning the lift-off layer and the photoresist; sequentially forming an intermediate layer comprising an emission layer, an opposite electrode, and a passivation layer in the opening and on the photoresist, wherein the opposite electrode in the opening contacts the auxiliary electrode while covering the intermediate layer; and removing the lift-off layer and the photoresist.

The auxiliary electrode may surround the pixel electrode.

The opposite electrode and the passivation layer may be formed by a vapor deposition method.

The method of manufacturing an organic light-emitting display device may further include: forming a second insulating film between the substrate and the auxiliary electrode, wherein the auxiliary electrode and the first insulating film may be on the second insulating film.

The pixel electrode and the auxiliary electrode may be formed in an identical mask process using an identical material.

According to an exemplary embodiment of the present inventive concept, a light-emitting display device includes: a substrate; a pixel electrode on the substrate; an auxiliary electrode on the substrate; an insulating film between the pixel electrode and the auxiliary electrode and overlapping the pixel electrode and the auxiliary electrode; an intermediate layer overlapping the pixel electrode and the insulating film; an opposite electrode covering the intermediate layer and contacting the auxiliary electrode; and a passivation layer covering the opposite electrode and contacting the auxiliary electrode.

BRIEF DESCRIPTION OF THE DRAWINGS

The above and other features of the present inventive concept will become more apparent by describing in detail exemplary embodiments thereof, with reference to the accompanying drawings in which.

DETAILED DESCRIPTION OF THE EMBODIMENTS

Figure 1:
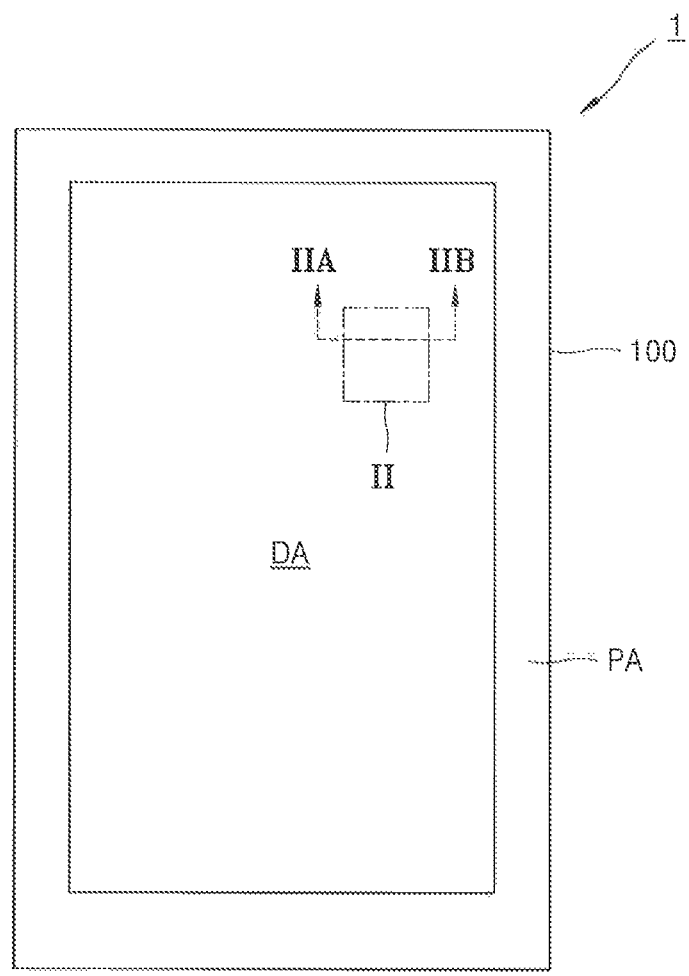
FIG. 1 is a plan view of an organic light-emitting display device according to a first exemplary embodiment of the present inventive concept.

Exemplary embodiments of the present inventive concept will now be described with reference to the accompanying drawings. The inventive concept may, however, be embodied in many different forms and should not be construed as being limited to the embodiments set forth herein.

An expression used in the singular encompasses the expression of the plural, unless it has a clearly different meaning in the context.

It will be understood that when a layer, region, or component is referred to as being "formed on" another layer, region, or component, it can be directly formed on the other layer, region, or component, or intervening layers, regions, or components may be present.

Sizes of components in the drawings may be exaggerated for convenience of explanation. In addition, like reference numerals may refer to like elements throughout the specification.

Figure 2:
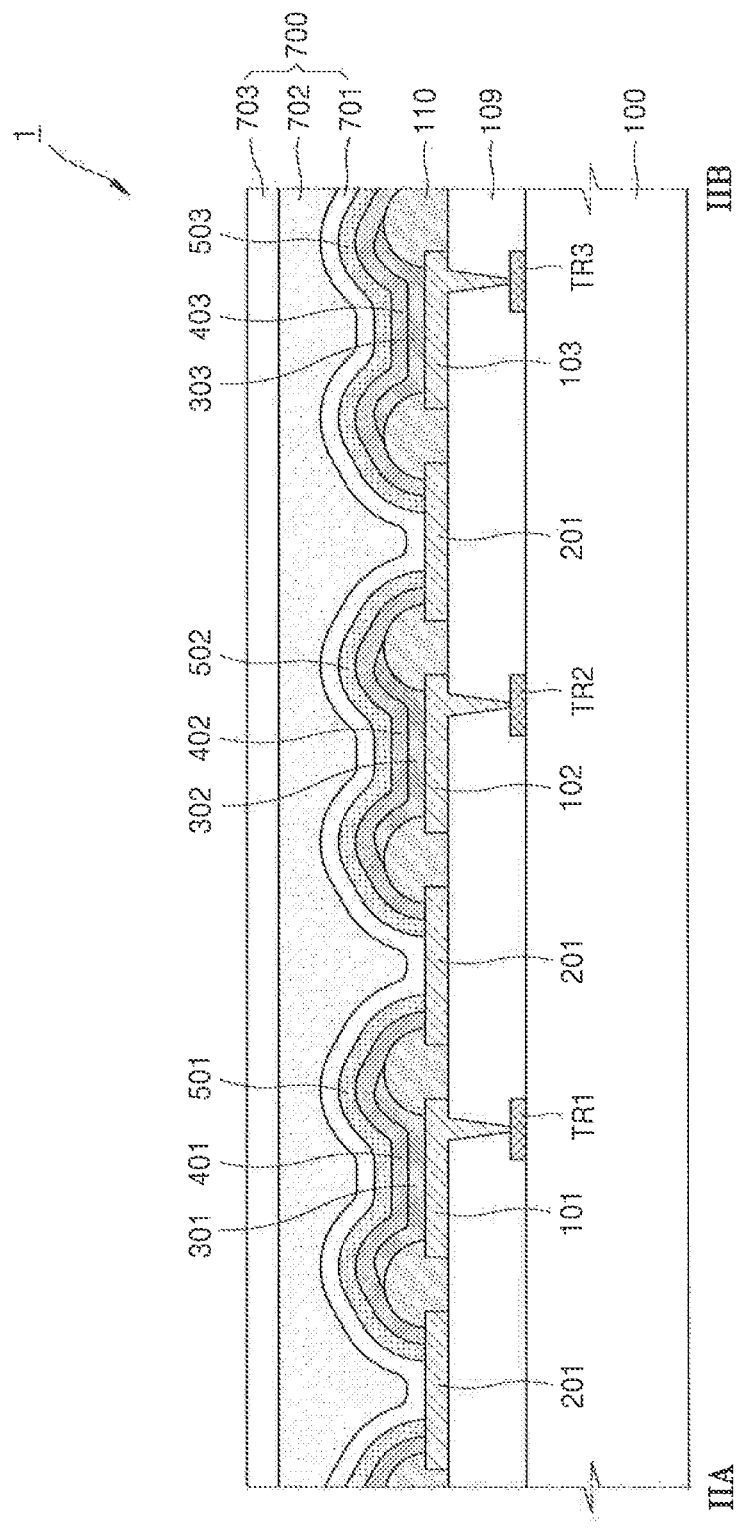
FIG. 2 is a cross-sectional view taken along line IIA-IIB of FIG. 1.
Figure 3A:
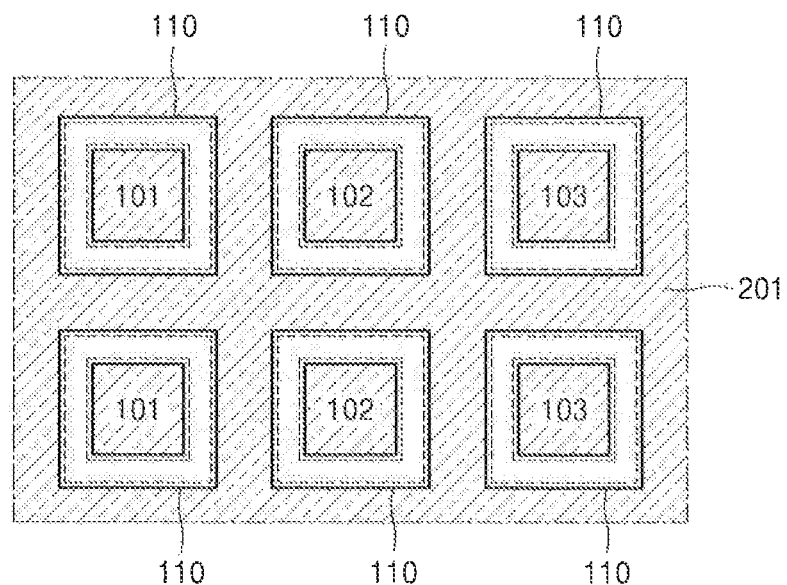
FIGS. 3A and 3B are plan views of a partial configuration of a region II in FIG. 1.
Figure 3B:
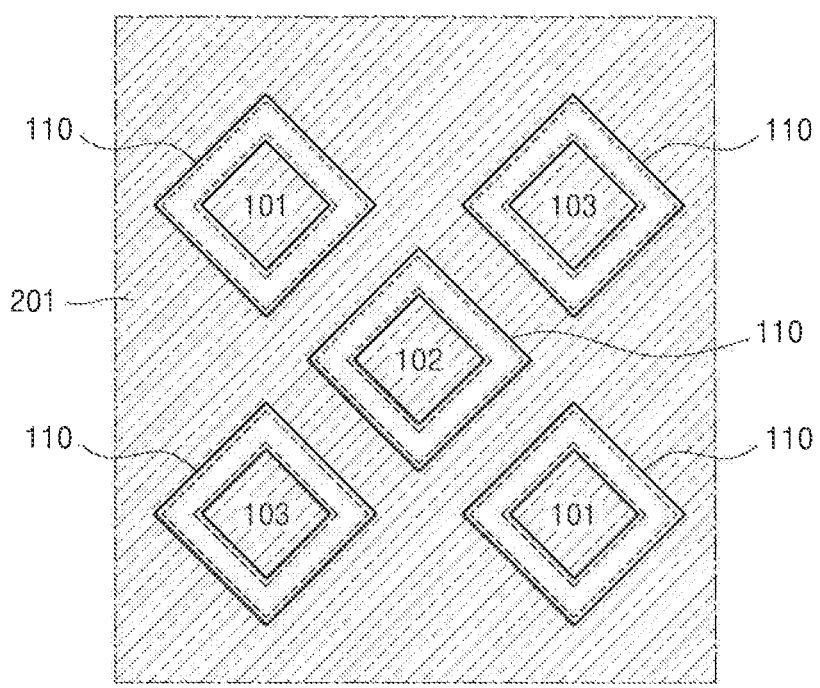

FIG. 1 is a plan view of an organic light-emitting display device 1 according to a first exemplary embodiment of the present inventive concept, FIG. 2 is a cross-sectional view taken along line IIA-IIB of FIG. 1, and FIGS. 3A and 3B are plan views of a partial configuration of a region II in FIG. 1.

Referring to FIG. 1, the organic light-emitting display device 1 according to the first embodiment has a display area DA on a substrate 100 and a peripheral area PA that is a non-display area located outside the display area DA. For example, the peripheral area PA may surround the display area DA.

The display area DA is an area for displaying an image, and a plurality of pixels including an organic light-emitting device may be arranged in the display area DA. Each pixel may include at least two thin-film transistors and at least one capacitor. The peripheral area PA is an area in which no image is displayed, and a circuit portion for applying an electrical signal to the display area DA, wiring and the like may be arranged in the peripheral area PA.

Referring to FIG. 2, the organic light-emitting display device 1 according to the present embodiment includes first, second and third pixel electrodes 101, 102, and 103 spaced apart from each other on the substrate 100, and an auxiliary electrode 201 between the first to third pixel electrodes 101, 102, and 103.

A thin-film transistor layer 109 including first, second and third thin-film transistors TR1, TR2, and TR3 is arranged between the substrate 100 and the first to third pixel electrodes 101, 102, and 103. The first to third thin film transistors TR1, TR2, and TR3 may be driving thin film transistors connected to the first to third pixel electrodes 101, 102, and 103, respectively.

A first insulating film 110 covers ends of the first to third pixel electrodes 101, 102, and 103 and an end of the auxiliary electrode 201. The first insulating film 110 covers the ends of the first to third pixel electrodes 101, 102, and 103 to prevent electric field concentration at each end and may function as a pixel-defining layer for defining a light-emitting region.

FIGS. 3A and 3B show examples of an arrangement relationship of the first to third pixel electrodes 101, 102, and 103, the auxiliary electrode 201, and the first insulating film 110 of the present embodiment, as a partial configuration of a region II in FIG. 1.

Referring to FIG. 3A, the first to third pixel electrodes 101, 102, and 103 are spaced apart from each other. The same pixel electrodes are arranged in the same column, and different pixel electrodes are arranged in a matrix in the same row. For example, the first pixel electrodes 101 may be arranged in a first column.

The auxiliary electrode 201 is spaced apart from the first to third pixel electrodes 101, 102, and 103 and surrounds the first to third pixel electrodes 101, 102, and 103. FIGS. 3A and 3B show a structure in which the auxiliary electrode 201 is integrally formed. However, the present inventive concept is not limited thereto. The auxiliary electrode 201 may be electrically connected to wiring on a layer different from the auxiliary electrode 201 through a contact hole.

The first insulating film 110 is arranged between the first pixel electrode 101 and the auxiliary electrode 201, between the second pixel electrode 102 and the auxiliary electrode 201, and between the third pixel electrode 103 and the auxiliary electrode 201, respectively. The first insulating film 110 may surround the first to third pixel electrodes 101, 102, and 103 in a closed loop shape, respectively.

Referring to FIG. 3B, the first to third pixel electrodes 101, 102, and 103 are spaced apart from each other. The first to third pixel electrodes 101, 102, and 103 may be arranged in a rhombic-like shape, and the rhombic-like shape may have a pentile arrangement in which the first pixel electrode 101 and the third pixel electrode 103 are arranged radially with the second pixel electrode 102 as a center.

Similar to FIG. 3A, the auxiliary electrode 201 is arranged to be spaced apart from the first to third pixel electrodes 101, 102, and 103 and surrounds the first to third pixel electrodes 101, 102, and 103. The first insulating film 110 is arranged between the first pixel electrode 101 and the auxiliary electrode 201, between the second pixel electrode 102 and the auxiliary electrode 201, and between the third pixel electrode 103 and the auxiliary electrode 201, respectively. The first insulating film 110 may surround the first to third pixel electrodes 101, 102, and 103 in a closed loop shape, respectively.

In FIGS. 3A and 3B, sizes of the first to third pixel electrodes 101, 102 and 103 are the same, but this is only an example. The sizes of the pixel electrodes may differ. In addition, the present embodiment may be applied to various pixel electrode arrangements different from that shown in FIGS. 3A and 3B.

Referring again to FIG. 2, first, second and third intermediate layers 301, 302, and 303 are arranged on the first to third pixel electrodes 101, 102, and 103, respectively.

The first to third intermediate layers 301, 302, and 303 include first, second and third emission layers, respectively. The first to third emission layers may emit light of different colors. In an exemplary embodiment of the present inventive concept, the first emission layer may emit red light, the second emission layer may emit green light, and the third emission layer may emit blue light. In the present embodiment, the first to third intermediate layers 301, 302, and 303 including the first to third emission layers are arranged in the display area DA, but the present inventive concept is not limited thereto. Another exemplary embodiment of the present inventive concept may include a fourth intermediate layer in addition to the first to third emission layers and a fourth emission layer that emits white light.

The first to third intermediate layers 301, 302, and 303 may further include a hole injection layer, a hole transport layer, an electron transport layer, or an electron injection layer.

First, second and third opposite electrodes 401, 402, and 403 are arranged on the first to third intermediate layers 301, 302, and 303 and cover the first to third intermediate layers 301, 302, and 303, respectively. The first opposite electrode 401 covers the first intermediate layer 301 and extends to the auxiliary electrode 201 to contact the auxiliary electrode 201, the second opposite electrode 402 covers the second intermediate layer 302 and extends to the auxiliary electrode 201 to contact the auxiliary electrode 201, and the third opposite electrode 403 covers the third intermediate layer 303 and extends to the auxiliary electrode 201 to contact the auxiliary electrode 201.

The auxiliary electrode 201 is electrically connected to a common power supply voltage, and the common power supply voltage is applied to each of the first to third opposite electrodes 401, 402, and 403 in contact with the auxiliary electrode 201. When a driving current is transmitted from a driving thin-film transistor to the first to third pixel electrodes 101 to 103 and the common power supply voltage is applied to the first to third opposite electrodes 401 to 403 through the auxiliary electrode 201, the first to third emission layers emit light.

First, second and third passivation layers 501, 502, and 503 are arranged on the first to third opposite electrodes 401, 402, and 403, respectively.

The first passivation layer 501 completely covers the first opposite electrode 401 and extends to the auxiliary electrode 201 so that an end of the first passivation layer 501 contacts an upper surface of the auxiliary electrode 201. The second passivation layer 502 completely covers the second opposite electrode 402 and extends to the auxiliary electrode 201 so that an end of the second passivation layer 502 contacts the upper surface of the auxiliary electrode 201. The third passivation layer 503 completely covers the third opposite electrode 403 and extends to the auxiliary electrode 201 so that an end of the third passivation layer 503 contacts the upper surface of the auxiliary electrode 201.

The first to third passivation layers 501, 502 and 503 completely cover the first to third intermediate layers 301, 302, and 303 and the first to third opposite electrodes 401, 402, and 403, respectively. As a result, an organic light-emitting device may be prevented from being damaged in a patterning operation to be described later below.

In the present embodiment, the first to third pixel electrodes 101, 102, and 103 may be spaced apart from each other in an island shape, and the first to third intermediate layers 301, 302, and 303 may also be arranged in an island shape on the first to third pixel electrodes 101, 102, and 103. The first to third passivation layers 501, 502, and 503 covering the first to third opposite electrodes 401, 402, and 403 may also be arranged in an island shape.

A sealing member 700 covering the entire upper surface of the first to third passivation layers 501, 502, and 503 and the auxiliary electrode 201 is arranged on the substrate 100.

The sealing member 700 may include at least one organic layer and at least one inorganic layer. FIG. 2 shows a structure in which a first inorganic layer 701, an organic layer 702, and a second inorganic layer 703 are sequentially stacked.

The organic layer 702 may include a polymer material such as polymethylmethacrylate (PMMA), polycarbonate (PC), polystyrene (PS), acrylic resin, epoxy resin, polyimide, and polyethylene. The first and second inorganic layers 701 and 703 may include aluminum nitride (AlN), aluminum oxide ($Al_2O_3$), titanium nitride (TiN), titanium oxide ($TiO_2$), silicon oxynitride (SiON), silicon nitride (SiNx), silicon oxide (SiOx), and the like.

The sealing member 700 may prevent the organic light-emitting device from being damaged by moisture together with the first to third passivation layers 501, 502, and 503 by preventing moisture permeation.

The method of manufacturing the organic light-emitting display device 1 according to the first embodiment and the organic light-emitting display device 1 manufactured by the manufacturing method will be described in more detail with reference to FIGS. 4 to 7E.

Figure 4:
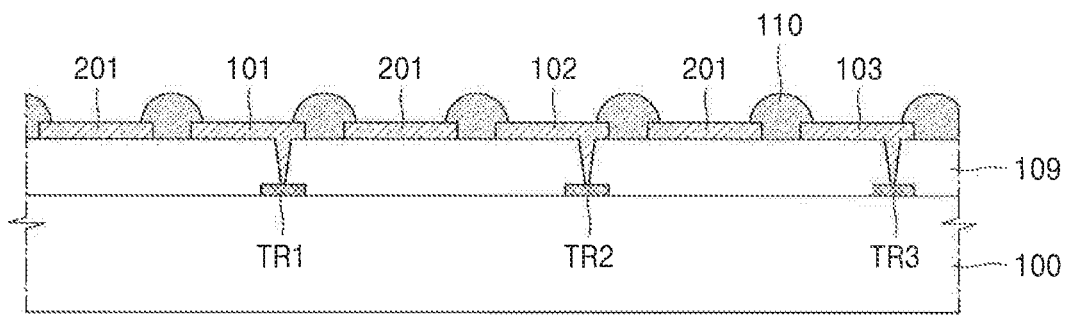
FIG. 4 is a cross-sectional view of an operation of forming first to third pixel electrodes, an auxiliary electrode, and a first insulating film on a substrate of the organic light-emitting display device according to the first embodiment.

FIG. 4 is a cross-sectional view of an operation of forming the first to third pixel electrodes 101, 102, and 103, the auxiliary electrode 201, and the first insulating film 110 on the substrate 100 of the organic light-emitting display device 1 according to the first embodiment, FIGS. 5A to 5E are cross-sectional views of a first unit process of the organic light-emitting display device 1 according to the first embodiment, FIGS. 6A to 6E are cross-sectional views of a second unit process of the organic light-emitting display device 1 according to the first embodiment, and FIGS. 7A to 7E are cross-sectional views of a third unit process of the organic light-emitting display device 1 according to the first embodiment.

Referring to FIG. 4, the first to third pixel electrodes 101, 102, and 103 are spaced apart from each other on the substrate 100 and the auxiliary electrode 201 is arranged between the first to third pixel electrodes 101 to 103. For example, the auxiliary electrode 201 is arranged between the first pixel electrode 101 and the second pixel electrode 102 and the auxiliary electrode 201 is arranged between the second pixel electrode 102 and the third pixel electrode 103. The first insulating film 110 is formed to cover ends of the first to third pixel electrodes 101 and 102 and an end of the auxiliary electrode 201 and the first to third thin-film transistors TR1, TR2, and TR3 are connected to the first to third pixel electrodes 101, 102, and 103, respectively.

The substrate 100 may include various materials such as a glass material or a plastic material such as polyethylene terephthalate (PET), polyethylene naphthalate (PEN), and polyimide. When the substrate 100 includes a plastic material, the flexibility thereof may be better as compared with a case where the substrate 100 includes a glass material. A buffer layer including SiOx and/or SiNx or the like formed to prevent penetration of impurities may be provided on the substrate 100.

The buffer layer may be further formed on the substrate 100 to form a smooth surface and prevent impurities from penetrating therebelow. For example, the buffer layer may be a single layer or multilayer including SiNx or SiOx.

The first to third pixel electrodes 101, 102, and 103 and the auxiliary electrode 201 are formed by forming a conductive material layer and patterning the conductive material layer.

The conductive material layer may include a reflective layer formed of Mg, Al, Pt, Pd, Au, Ni, Nd, Ir, Cr or a compound thereof or a transparent conductive oxide (TCO) film above or below the reflective layer. Alternatively, the conductive material layer may be a thin film including silver (Ag) or an Ag alloy, or may include a transparent conductive oxide film formed on the thin film. Depending on the conductive material layer, the first to third pixel electrodes 101, 102, and 103 may include a reflective electrode or a transparent electrode.

The auxiliary electrode 201 includes the same material as the first to third pixel electrodes 101, 102, and 103 and is formed in the same patterning process as the first to third pixel electrodes 101, 102, and 103. The auxiliary electrode 201 is spaced apart from the first to third pixel electrodes 101, 102, and 103 and surrounds the periphery thereof. In the present embodiment, since the auxiliary electrode 201 is formed in the same patterning process as the first to third pixel electrodes 101, 102, and 103, the process may be simplified and damage to the first to third pixel electrodes 101, 102, and 103 may be prevented.

Thereafter, an insulating film is formed and patterned to form the first insulating film 110. The first insulating film 110 covers the ends of the first to third pixel electrodes 101, 102, and 103 and the ends of the auxiliary electrode 201. The first insulating film 110 may include an organic insulating material or an inorganic insulating material.

Figure 5A:
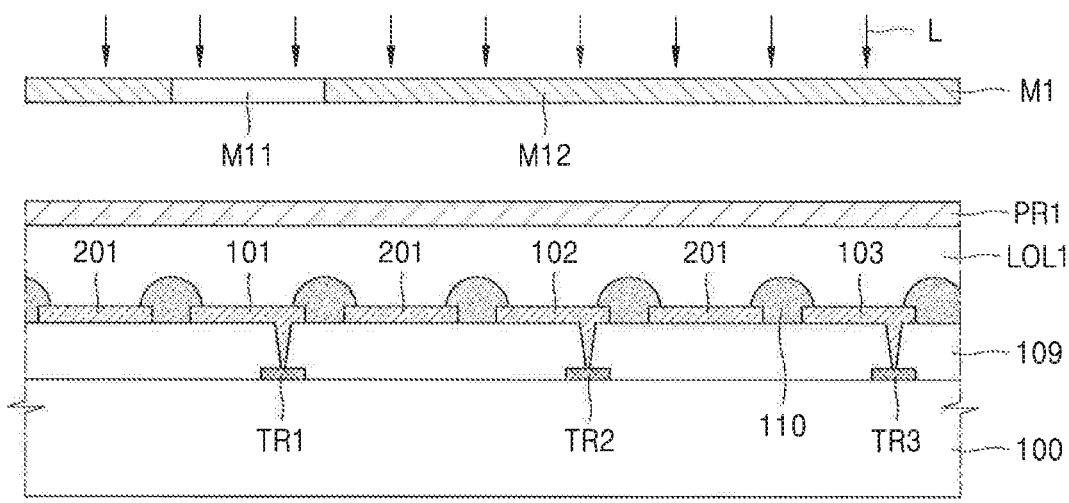
FIGS. 5A, 5B, 5C, 5D and 5E are cross-sectional views of a first unit process of the organic light-emitting display device according to the first embodiment.

Referring to FIG. 5A, a first lift-off layer LOL1 and a first photoresist PR1 are sequentially formed on the structure of FIG. 4.

The first lift-off layer LOL1 may include a non-photosensitive organic material. The first lift-off layer LOL1 may include a fluoropolymer. The fluoropolymer included in the first lift-off layer LOL1 may be formed of a polymer including about 20 to about 60 wt % of fluorine content. For example, a fluoropolymer included in the first lift-off layer LOL1 may include polytetrafluoroethylene, polychlorotrifluoroethylene, polydichlorodifluoroethylene, a copolymer of chlorotrifluoroethylene and dichlorodifluoroethylene, a copolymer of tetrafluoroethylene and perfluoroalkyl vinylether, a copolymer of chlorotrifluoroethylene and perfluoroalkyl vinylether, a copolymer of tetrafluoroethylene and perfluoroalkyl vinylether, a copolymer of perfluoroalkyl vinylether and perfluoroalkyl vinylether, a copolymer of tetrafluoroethylene and perfluoroalkyl vinylether, or a copolymer of chlorotrifluoroethylene and perfluoroalkyl vinylether. The first lift-off layer LOL1 may be formed by a coating method, a printing method, a vapor deposition method, or the like.

The first photoresist PR1 is formed on the first lift-off layer LOL1. The first photoresist PR1 at a position corresponding to the first pixel electrode 101 is exposed through a first photomask M1 including a light-transmitting portion M11 and a light-blocking portion M12.

Figure 5B:
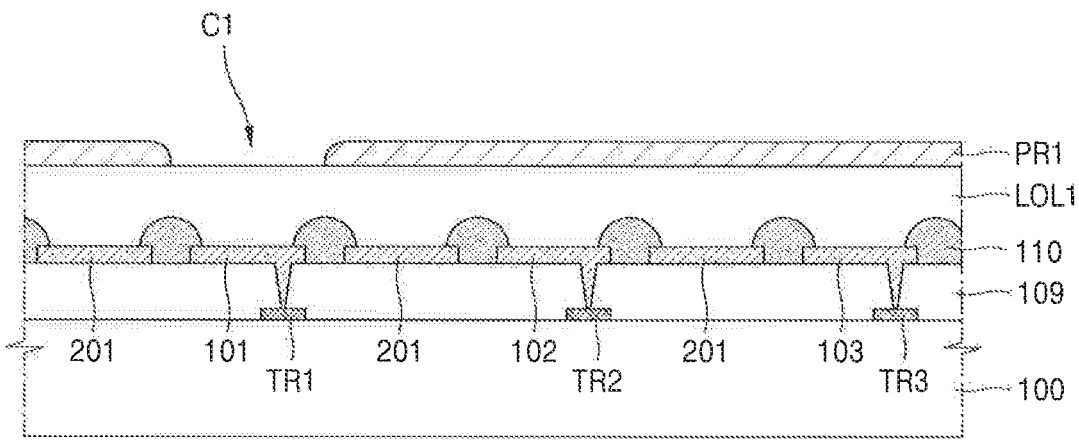

Referring to FIG. 5B, the first photoresist PR1 is developed. The first photoresist PR1 may be a positive type or a negative type. In the present embodiment, the positive type will be described as an example. The developed first photoresist PR1 has a first opening C1 at a portion corresponding to the first pixel electrode 101.

Figure 5C:
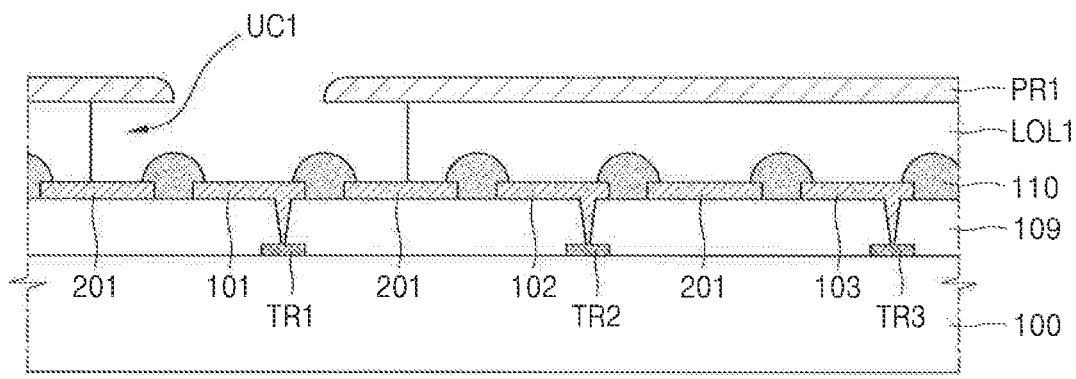

Referring to FIG. 5C, the first lift-off layer LOL1 is etched using the patterned first photoresist PR1 of FIG. 5B as an etching mask.

When the first lift-off layer LOL1 includes a fluoropolymer, an etchant uses a solvent capable of etching the fluoropolymer. A first solvent may include hydrofluoroether. The hydrofluoroether is an electrochemically stable material with low interaction with other materials, and is environmentally stable because of its low global warming potential and low toxicity.

Upon etching the first lift-off layer LOL1 by an etching process, the first solvent including fluorine forms a first undercut profile UC1 below the first opening C1 of the first photoresist PR1.

Figure 5D:
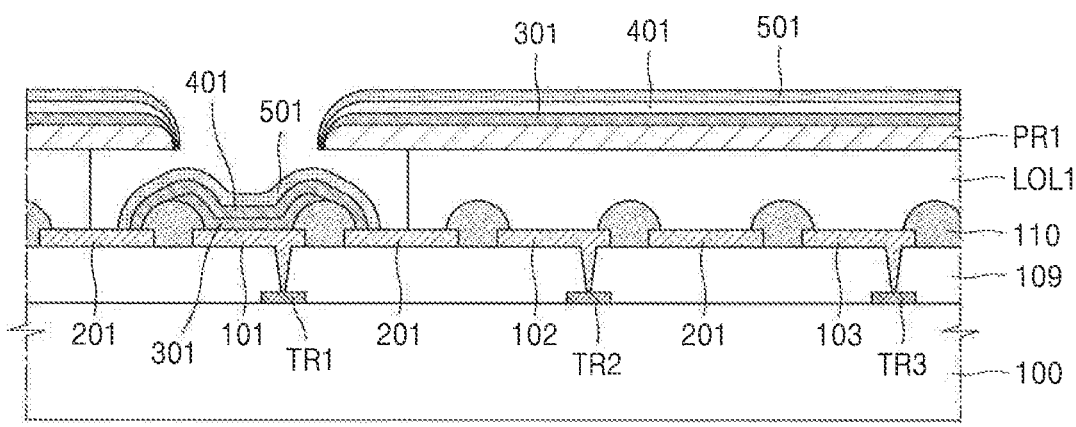

Referring to FIG. 5D, the first intermediate layer 301, the first opposite electrode 401, and the first passivation layer 501 including a first emission layer are formed on the structure of FIG. 5C. The first intermediate layer 301 may be formed to further include a hole injection layer, a hole transport layer, an electron transport layer, or an electron injection layer.

The first intermediate layer 301, the first opposite electrode 401, and the first passivation layer 501 are formed by vacuum deposition. A deposition material discharged from a deposition source is sequentially deposited by controlling a deposition angle of incidence to the substrate 100.

The first intermediate layer 301 is stacked on an upper surface of the first pixel electrode 101 and an upper surface of the first insulating film 110. The first opposite electrode 401 is stacked on and in contact with an upper surface of the first intermediate layer 301, the first insulating film 110, and the auxiliary electrode 201. The first passivation layer 501 is stacked on and in contact with an upper surface of the first opposite electrode 401 and the auxiliary electrode 201. The first intermediate layer 301, the first opposite electrode 401, and the first passivation layer 501 are also stacked on the first photoresist PR1.

The first passivation layer 501 may include an oxide, oxynitride, or nitride. The first passivation layer 501 may be formed by a vapor deposition method.

The first lift-off layer LOL1 may include a non-photosensitive organic material. The first lift-off layer LOLA may include a fluoropolymer. The fluoropolymer included in the first lift-off layer LOU may be formed of a polymer including about 20 to about 60 wt % of fluorine content.

Since the first passivation layer 501 entirely covers the first intermediate layer 301, the first intermediate layer 301 including a first emission layer may be prevented from being damaged by a first solvent used in a lift-off process to be described later below.

Figure 5E:
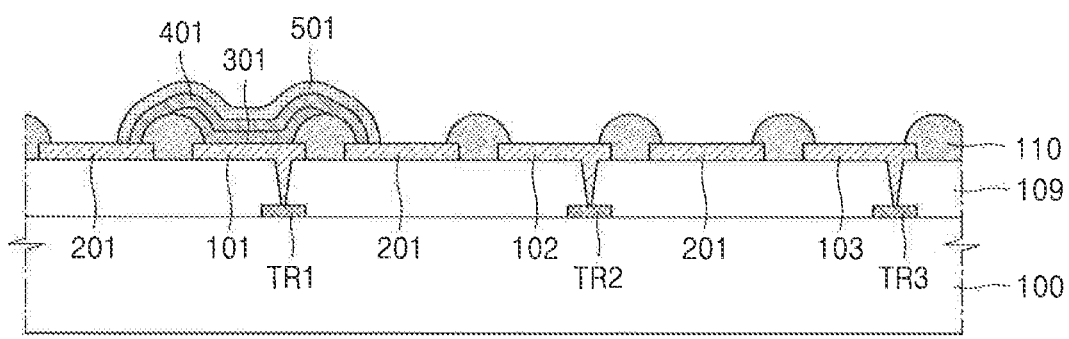

Referring to FIG. 5E, the lift-off process is performed on the structure of FIG. 5D.

When the first lift-off layer LOL1 includes a fluoropolymer, the first lift-off layer LOL1 may be removed using a second solvent including fluorine. Since the lift-off process is performed after formation of the first intermediate layer 301 including a first emission layer, a material having a low reactivity with the first intermediate layer 301 may be used as the second solvent. The second solvent may include hydrofluoroether as well as the first solvent.

As a result of the lift-off process, the first intermediate layer 301, the first opposite electrode 401, and the first passivation layer 501 arranged on the first pixel electrode 101, the first insulating film 110, and the auxiliary electrode 201 remain as a pattern.

Figure 6A:
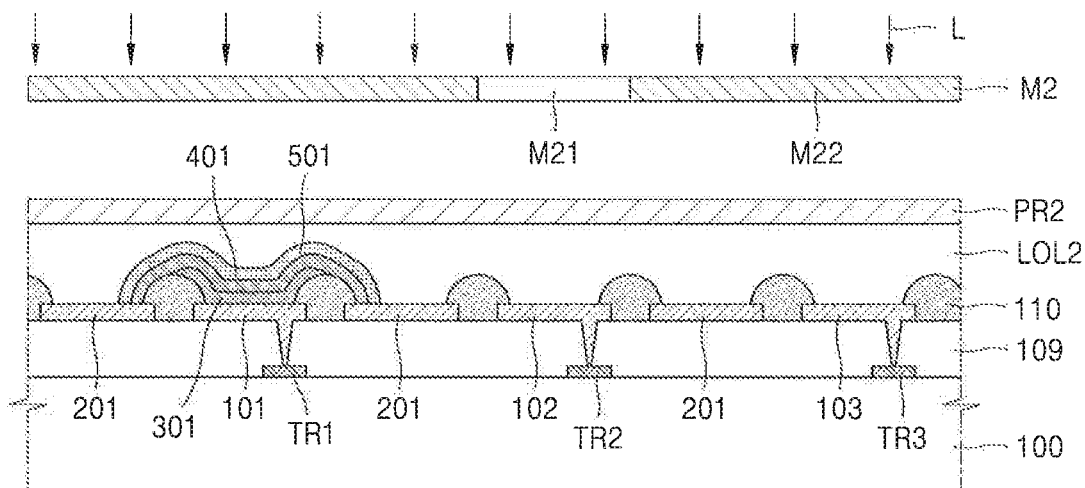
FIGS. 6A, 6B, 6C, 6D and SE are cross-sectional views of a second unit process of the organic light-emitting display device according to the first embodiment.

Referring to FIG. 6A, a second lift-off layer LOL2 and a second photoresist PR2 are sequentially formed on the structure of FIG. 5E.

The second lift-off layer LOL2 may include the same material as the first lift-off layer LOL1 described above. The second lift-off layer LOL2 may be formed by a coating method, a printing method, a vapor deposition method, or the like.

The second photoresist PR2 is formed on the second lift-off layer LOL2. The second photoresist PR2 at a position corresponding to the second pixel electrode 102 is exposed through a second photomask M2 including a light-transmitting portion M21 and a light-blocking portion M22.

Figure 6B:
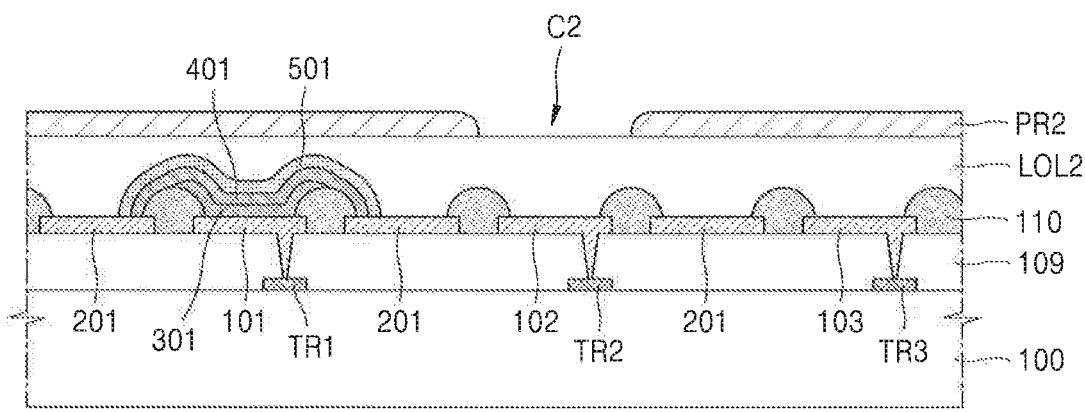

Referring to FIG. 6B, the second photoresist PR2 is developed. The developed second photoresist PR2 has a second opening C2 at a portion corresponding to the second pixel electrode 102.

Figure 6C:
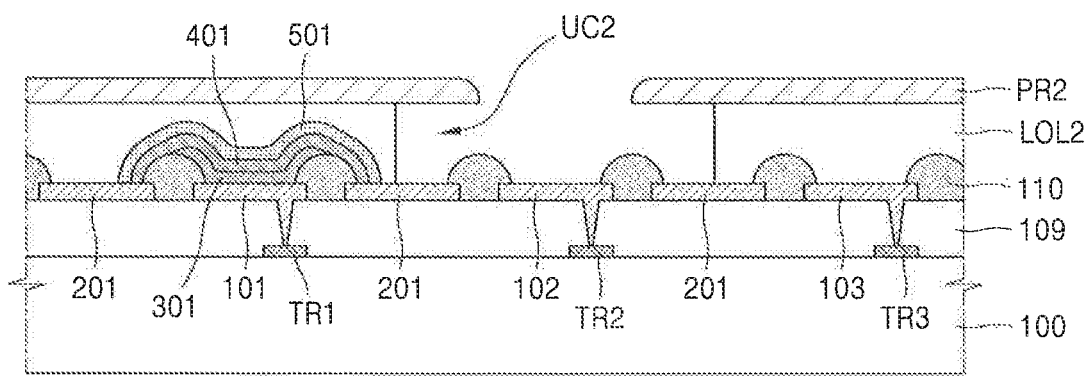

Referring to FIG. 6C, the second lift-off layer LOL2 is etched using the patterned second photoresist PR2 of FIG. 6B as an etching mask.

When the second lift-off layer LOL2 includes a fluoropolymer, an etchant uses a first solvent capable of etching the fluoropolymer. The first solvent may include hydrofluoroether. Upon etching the second lift-off layer LOL2 by an etching process, the first solvent including fluorine forms a second undercut profile UC2 below the second opening C2 of the second photoresist PR2.

Figure 6D:
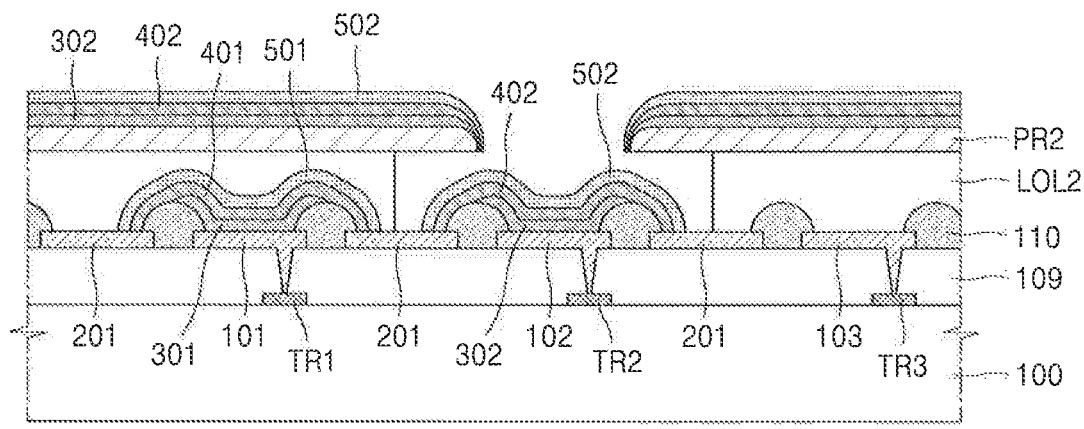

Referring to FIG. 6D, the second intermediate layer 302, the second opposite electrode 402, and the second passivation layer 502 including a second emission layer are formed on the structure of FIG. 6C. The second intermediate layer 302 may be formed to further include a hole injection layer, a hole transport layer, an electron transport layer, or an electron injection layer.

The second intermediate layer 302, the second opposite electrode 402, and the second passivation layer 502 are formed by vacuum deposition. A deposition material discharged from a deposition source is sequentially deposited by controlling a deposition angle of incidence to the substrate 100.

The second intermediate layer 302 is stacked on an upper surface of the second pixel electrode 102 and the upper surface of the first insulating film 110. The second opposite electrode 402 is stacked on and in contact with an upper surface of the second intermediate layer 302, the first insulating film 110, and the auxiliary electrode 201. The second passivation layer 502 is stacked on and in contact with an upper surface of the second opposite electrode 402 and the auxiliary electrode 201. The second intermediate layer 302, the second opposite electrode 402, and the second passivation layer 502 are also stacked on the second photoresist PR2.

The second lift-off layer LOL2 may include a non-photosensitive organic material. The second lift-off layer LOL2 may include a fluoropolymer. The fluoropolymer included in the second lift-off layer LOL2 may be formed of a polymer including about 20 to about 60 wt % of fluorine content.

Since the second passivation layer 502 entirely covers the second intermediate layer 302, the second intermediate layer 302 including a second emission layer may be prevented from being damaged by a first solvent used in a lift-off process to be described later below.

Figure 6E:
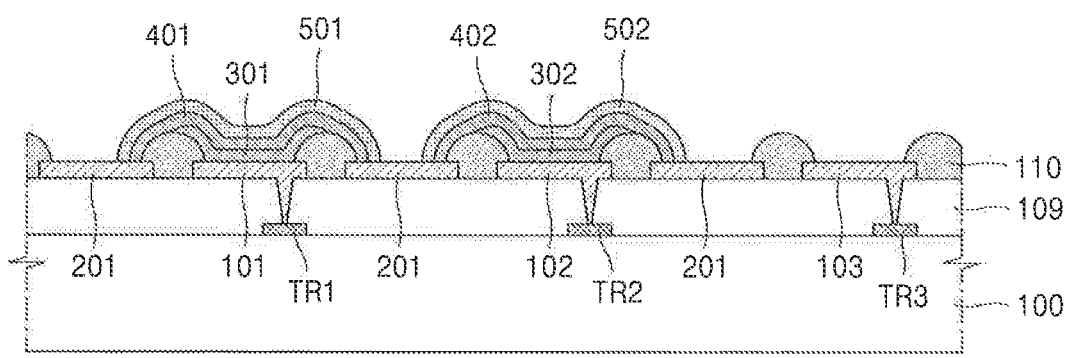

Referring to FIG. 6E, the lift-off process is performed on the structure of FIG. 6D.

When the second lift-off layer LOL2 includes a fluoropolymer, the second lift-off layer LOL2 may be removed using a second solvent including fluorine.

As a result of the lift-off process, the second intermediate layer 302, the second opposite electrode 402, and the second passivation layer 502 arranged on the second pixel electrode 102, the first insulating film 110, and the auxiliary electrode 201 remain as a pattern.

Figure 7A:
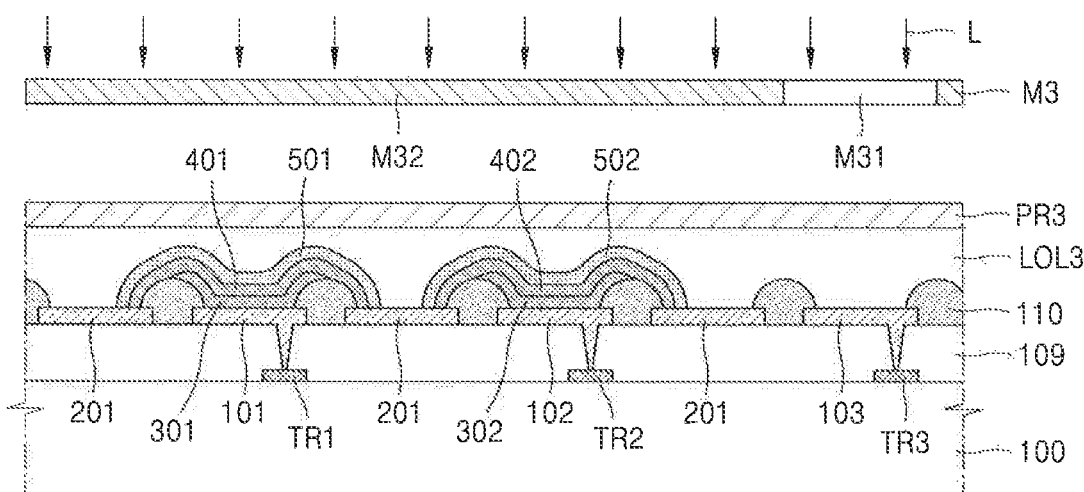
FIGS. 7A, 7B, 7C, 7D and 7E are cross-sectional views of a third unit process of the organic light-emitting display device according to the first embodiment.

Referring to FIG. 7A, a third lift-off layer LOL3 and a third photoresist PR3 are sequentially formed on the structure of FIG. 6E.

The third lift-off layer LOL3 may include the same material as the first and second lift-off layers LOL1 and LOL2 described above. The third lift-off layer LOL3 may be formed by a coating method, a printing method, a vapor deposition method, or the like.

The third photoresist PR3 is formed on the third lift-off layer LOL3. The third photoresist PR3 at a position corresponding to the third pixel electrode 103 is exposed through a third photomask M3 including a light-transmitting portion M31 and a light-blocking portion M32.

Figure 7B:
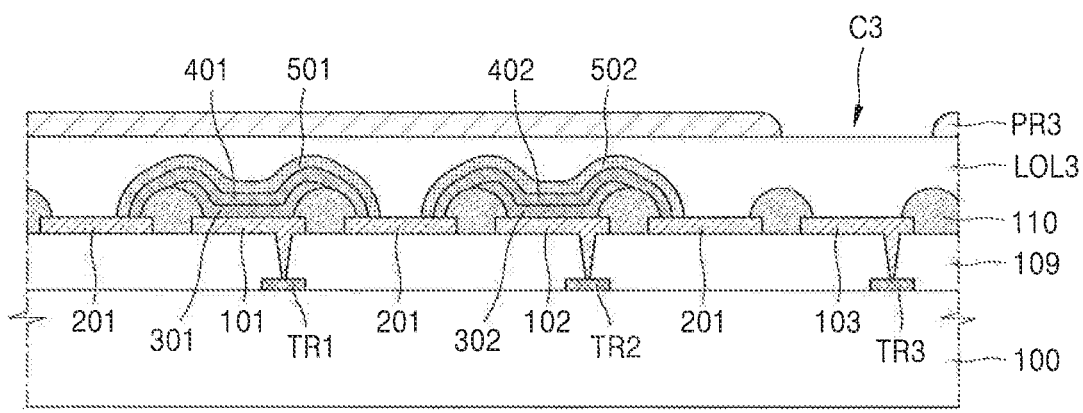

Referring to FIG. 7B, the third photoresist PR3 is developed. The developed third photoresist PR3 has a third opening C3 at a portion corresponding to the third pixel electrode 103.

Figure 7C:
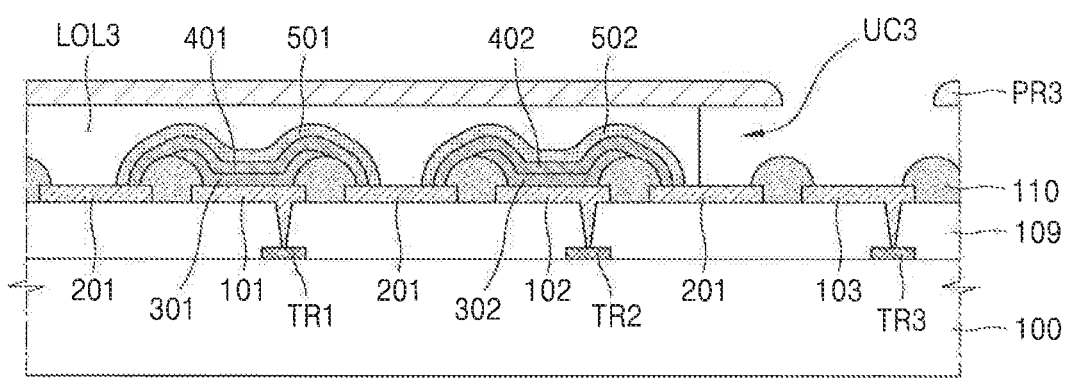

Referring to FIG. 7C, the third lift-off layer LOL3 is etched using the patterned third photoresist PR3 of FIG. 7B as an etching mask.

When the third lift-off layer LOL3 includes a fluoropolymer, an etchant uses a first solvent capable of etching the fluoropolymer. The first solvent may include hydrofluoroether. Upon etching the third lift-off layer LOL3 by an etching process, a first solvent including fluorine forms the third undercut profile UC3 below the third opening C3 of the third photoresist PR3.

Figure 7D:
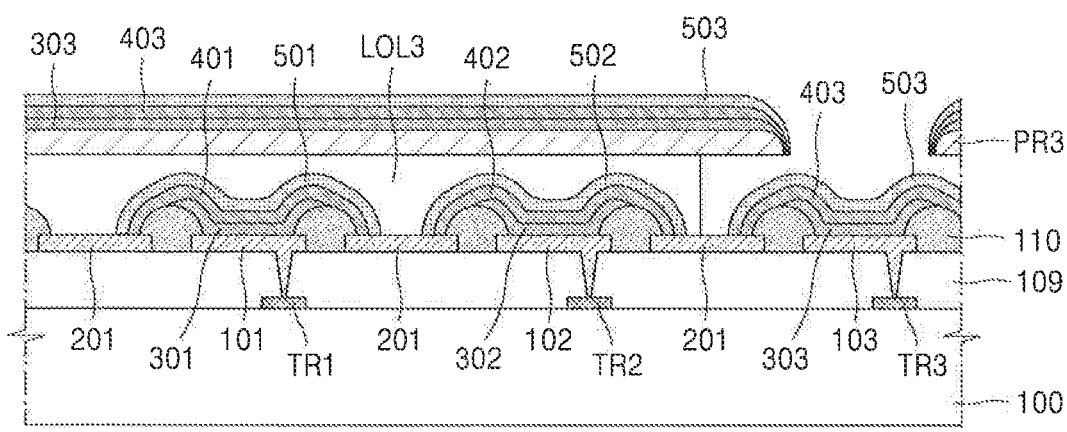

Referring to FIG. 7D, the third intermediate layer 303, the third opposite electrode 403, and the third passivation layer 503 including a third emission layer are formed on the structure of FIG. 7C. The third intermediate layer 303 may be formed to further include a hole injection layer, a hole transport layer, an electron transport layer, or an electron injection layer.

The third intermediate layer 303, the third opposite electrode 403, and the third passivation layer 503 are formed by vacuum deposition. A deposition material discharged from a deposition source is sequentially deposited by controlling a deposition angle of incidence to the substrate 100.

The third intermediate layer 303 is stacked on and in contact with an upper surface of the third pixel electrode 103 and the upper surface of the first insulating film 110. The third opposite electrode 403 is stacked on and in contact with the upper surface of the third intermediate layer 303, the first insulating film 110, and the auxiliary electrode 201. The third passivation layer 503 is stacked on and in contact with an upper surface of the third opposite electrode 403 and the auxiliary electrode 201. The third intermediate layer 303, the third opposite electrode 403, and the third passivation layer 503 are also stacked on the third photoresist PR3.

The third lift-off layer LOL3 may include a non-photosensitive organic material. The third lift-off layer LOL3 may include a fluoropolymer. The fluoropolymer included in the third lift-off layer LOL3 may be formed of a polymer including about 20 to about 60 wt % of fluorine content.

Since the third passivation layer 503 entirely covers the third intermediate layer 303, the third intermediate layer 303 including a third emission layer may be prevented from being damaged by a first solvent used in a lift-off process to be described later below.

Figure 7E:
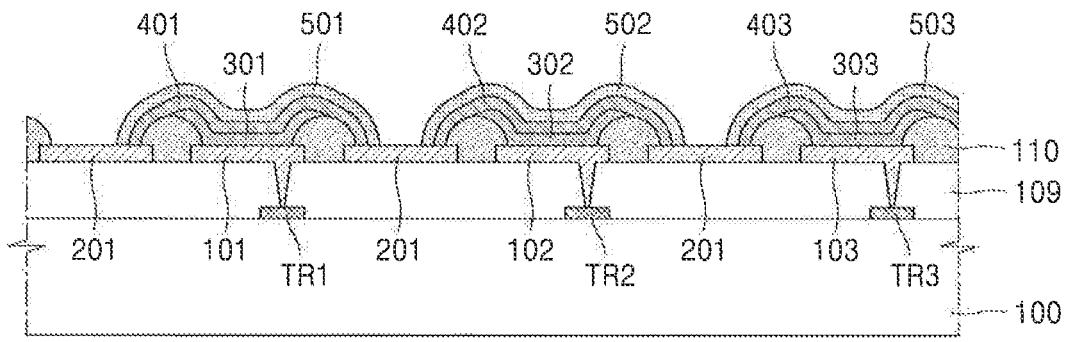

Referring to FIG. 7E, the lift-off process is performed on the structure of FIG. 7D, When the third lift-off layer LOL3 includes a fluoropolymer, the third lift-off layer LOL3 may be removed using a second solvent including fluorine. As a result of the lift-off process, the third intermediate layer 303, the third opposite electrode 403, and the third passivation layer 503 arranged on the third pixel electrode 103, the first insulating film 110, and the auxiliary electrode 201 remain as a pattern.

According to the above described embodiment of the present inventive concept, since an intermediate layer including an emission layer is formed by a lift-off process instead of deposition using a fine metal mask, a misalignment of the fine metal mask may be prevented and a manufacturing cost may be reduced.

Furthermore, according to the above described embodiment of the present inventive concept, since an auxiliary electrode is formed in the same process as that of a pixel electrode, it is possible to prevent the pixel electrode from being damaged by forming the auxiliary electrode without performing an additional photomask process.

Hereinafter, referring to FIGS. 8 to 12E, the organic light emitting display device 1R according to a comparative example in which a pixel electrode and an auxiliary electrode are not formed of the same material in the same process as the above described embodiment of the present inventive concept will be described.

Figure 8:
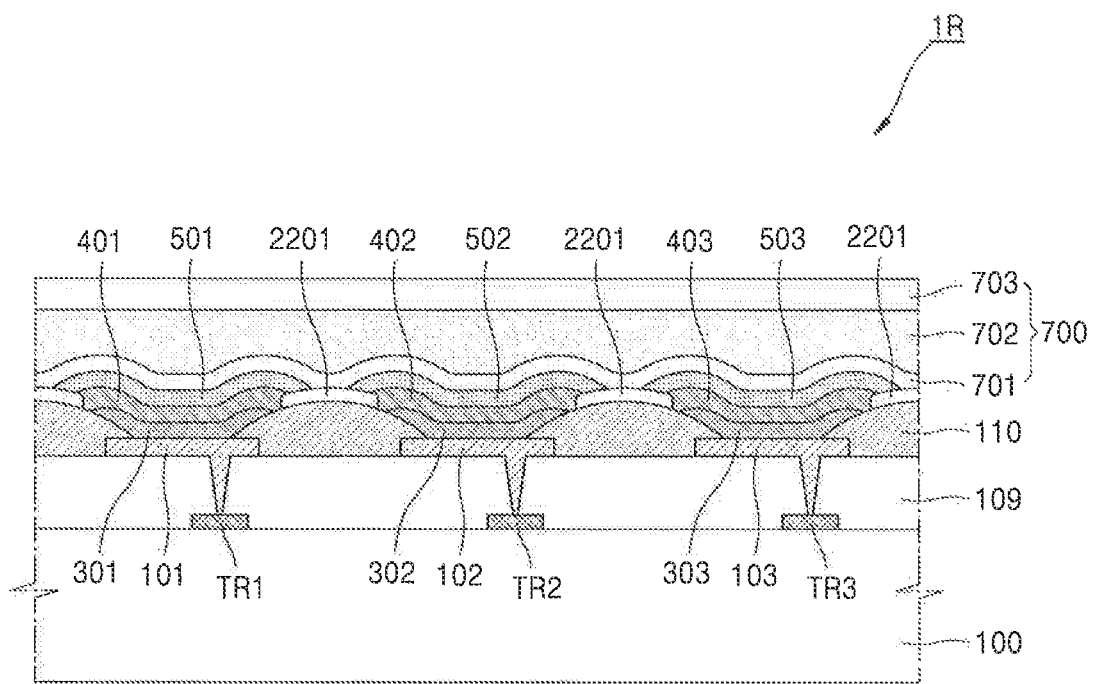
FIG. 8 is a plan view of an organic light-emitting display device according to a comparative example.
Figure 9:
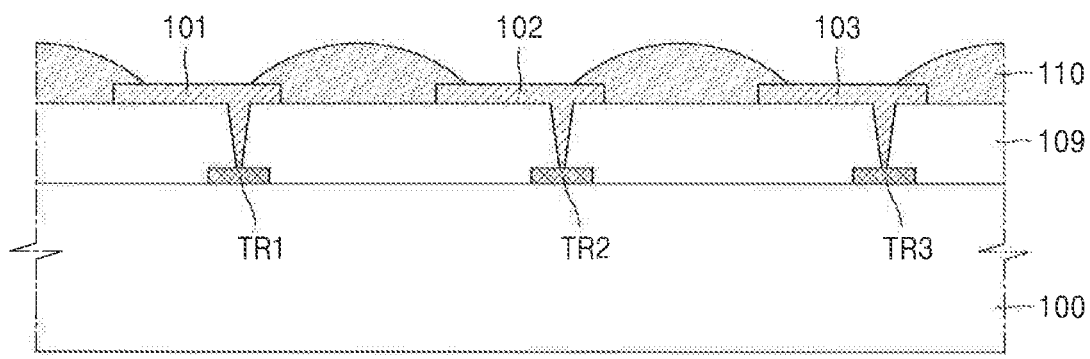
FIGS. 9, 10 and 11 are cross-sectional views of an operation of forming first to third pixel electrodes, an auxiliary electrode, and a first insulating film on a substrate of the organic light-emitting display device according to the comparative example.
Figure 10:
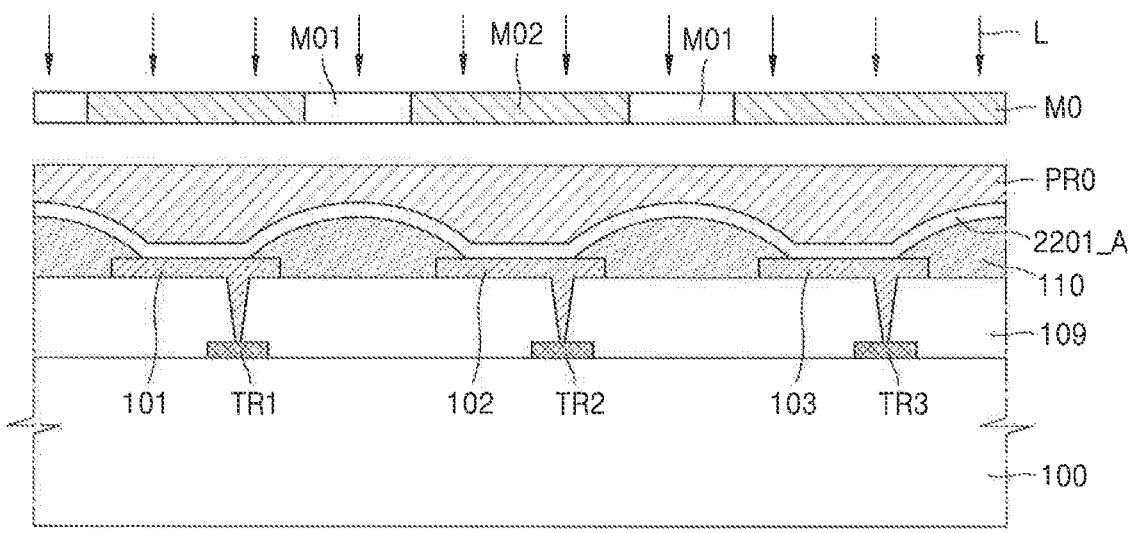
Figure 11:
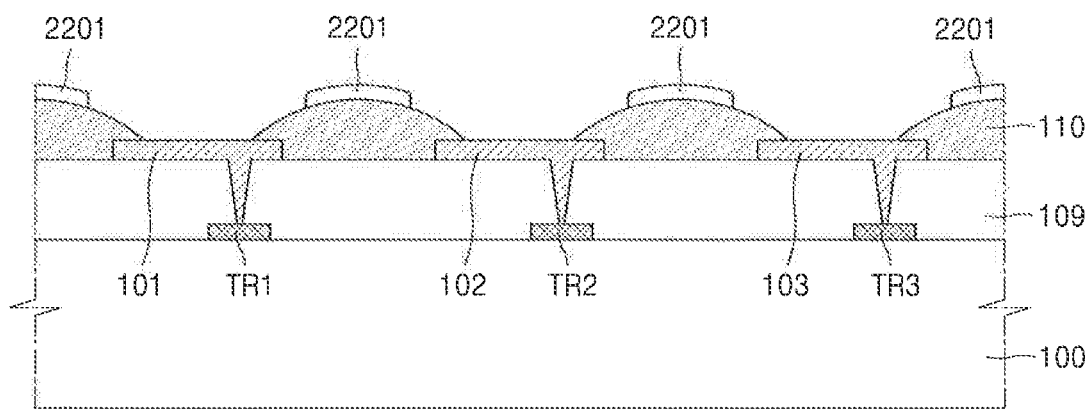

FIG. 8 is a plan view of the organic light-emitting display device 1R according to a comparative example, FIGS. 9 to 11 are cross-sectional views of an operation of forming the first to third pixel electrodes 101, 102, and 103, an auxiliary electrode 2201, and the first insulating film 110 on the substrate 100 of the organic light-emitting display device 1R according to the comparative example, and FIGS. 12A to 12E are cross-sectional views of a first unit process of the organic light-emitting display device 1R according to the comparative example.

Referring to FIG. 8, the organic light-emitting display device 1R according to the comparative example includes the first to third pixel electrodes 101, 102, and 103 spaced apart from each other on the substrate 100, and the auxiliary electrode 2201 between the first to third pixel electrodes 101, 102, and 103.

In the comparative example, the auxiliary electrode 2201 does not include the same material as the first to third pixel electrodes 101, 102, and 103 and is not on the same layer as the first to third pixel electrodes 101, 102, and 103. For example, the auxiliary electrode 2201 is arranged on the first insulating film 110.

The thin-film transistor layer 109 including the first to third thin-film transistors TR1, TR2, and TR3 is arranged between the substrate 100 and the first to third pixel electrodes 101, 102, and 103. The first to third thin film transistors TR1, TR2, and TR3 may be driving thin film transistors connected to the first to third pixel electrodes 101, 102, and 103, respectively.

The first insulating film 110 covers the ends of the first to third pixel electrodes 101, 102, and 103. The first insulating film 110 covers the ends of the first to third pixel electrodes 101, 102, and 103 to prevent an electric field concentration at each end and may function as a pixel-defining layer for defining a light-emitting region.

The first to third intermediate layers 301, 302, and 303 are arranged on the first to third pixel electrodes 101, 102, and 103, respectively.

The first to third opposite electrodes 401, 402, and 403 are arranged on the first to third intermediate layers 301, 302, and 303 and cover the first to third intermediate layers 301, 302, and 303, respectively. The first opposite electrode 401 covers the first intermediate layer 301 and extends to the auxiliary electrode 2201 to contact the auxiliary electrode 2201, the second opposite electrode 402 covers the second intermediate layer 302 and extends to the auxiliary electrode 2201 to contact the auxiliary electrode 2201, and the third opposite electrode 403 covers the third intermediate layer 303 and extends to the auxiliary electrode 2201 to contact the auxiliary electrode 2201.

The first to third passivation layers 501, 502, and 503 are arranged on the first to third opposite electrodes 401, 402, and 403, respectively.

The first passivation layer 501 completely covers the first opposite electrode 401 and extends to the auxiliary electrode 2201 so that an end of the first passivation layer 501 contacts an upper surface of the auxiliary electrode 2201. The second passivation layer 502 completely covers the second opposite electrode 402 and extends to the auxiliary electrode 2201 so that an end of the second passivation layer 502 contacts the upper surface of the auxiliary electrode 2201. The third passivation layer 503 completely covers the third opposite electrode 403 and extends to the auxiliary electrode 2201 so that an end of the third passivation layer 503 contacts the upper surface of the auxiliary electrode 2201. The sealing member 700 is arranged on the upper surface of the first to third passivation layers 501, 502, and 503.

The first to third passivation layers 501, 502 and 503 completely cover the first to third intermediate layers 301, 302, and 303 and the first to third opposite electrodes 401, 402 and 403, respectively.

In the comparative example, the auxiliary electrode 2201 is formed after the formation of the first to third pixel electrodes 101, 102, and 103 without including the same material as the first to third pixel electrodes 101, 102, and 103. For example, the auxiliary electrode 2201 is not formed in the same process as that of the first to third pixel electrodes 101, 102, and 103. Therefore, a process using a photomask is added, and the first to third pixel electrodes 101, 102, and 103 may be damaged by an etchant or the like when the auxiliary electrode 2201 is patterned.

Referring to FIG. 9, the first to third pixel electrodes 101, 102, and 103 are spaced apart from each other on the substrate 100, the first insulating film 110 is formed to cover the ends of the first to third pixel electrodes 101, 102, and 103, and the first to third thin-film transistors TR1, TR2, and TR3 are connected to the first to third pixel electrodes 101, 102, and 103, respectively.

Referring to FIGS. 10 and 11, a conductive material layer 2201_A is formed on the first to third pixel electrodes 101, 102, and 103 and the first insulating film 110 and a photoresist PR0 is formed on the conductive material layer 2201_A.

The photoresist PR0 on the first insulating film 110 located between the first to third pixel electrodes 101, 102, and 103 is exposed through a photomask M0 including a light-transmitting portion M01 and a light-blocking portion M02, and the auxiliary electrode 2201 is patterned.

Figure 12A:
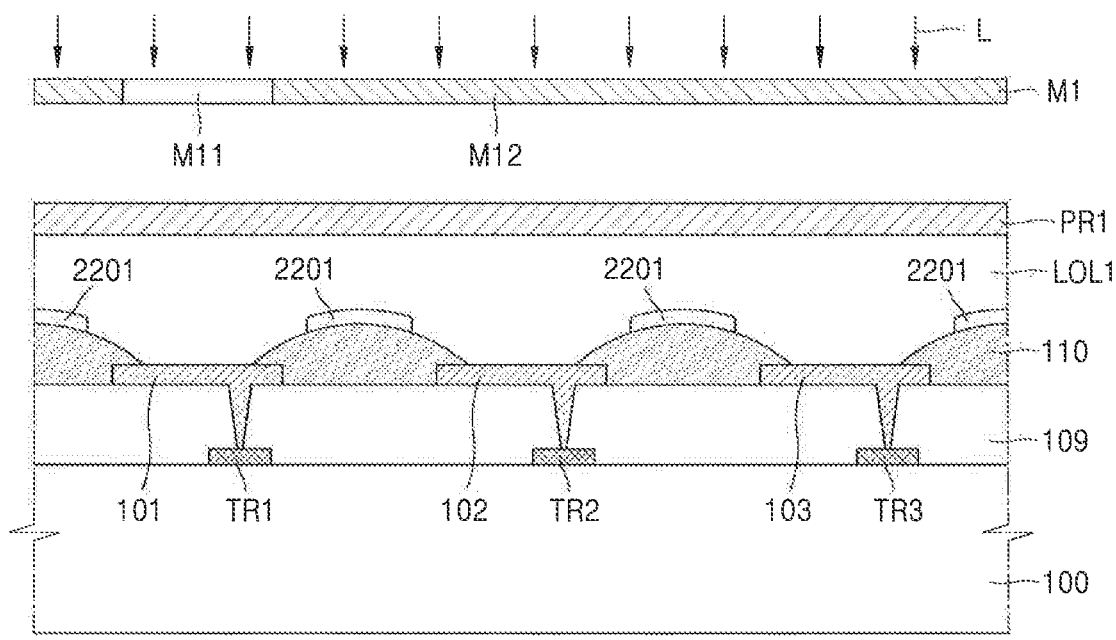
FIGS. 12A, 12B, 12C, 12D and 12E are cross-sectional views of a first unit process of the organic light-emitting display device according to the comparative example.

Referring to FIG. 12A, the first lift-off layer LOL1 and the first photoresist PR1 are sequentially formed on the structure of FIG. 11.

The first photoresist PR1 at a position corresponding to the first pixel electrode 101 is exposed through a first photomask M1 including a light-transmitting portion M11 and a light-blocking portion M12.

Figure 12B:
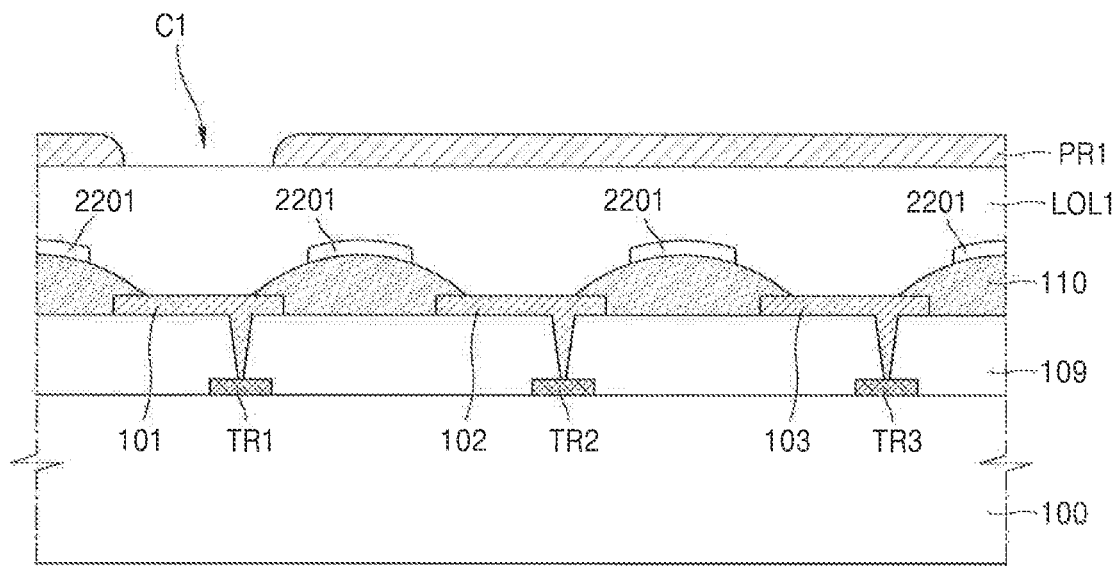

Referring to FIG. 12B, the first photoresist PR1 is developed. The developed first photoresist PR1 has a first opening C1 at a portion corresponding to the first pixel electrode 101.

Figure 12C:
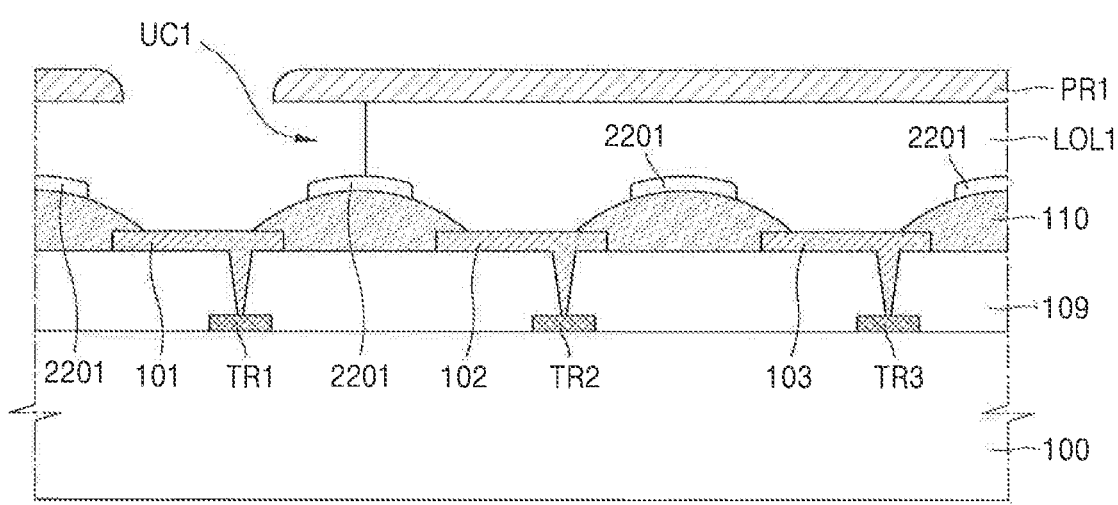

Referring to FIG. 12C, the first lift-off layer LOL1 is etched using the patterned first photoresist PR1 of FIG. 12B as an etching mask.

Upon etching the first lift-off layer LOL1 by an etching process, a first solvent including fluorine forms the first undercut profile UC1 below the first opening C1 of the first photoresist PR1.

Figure 12D:
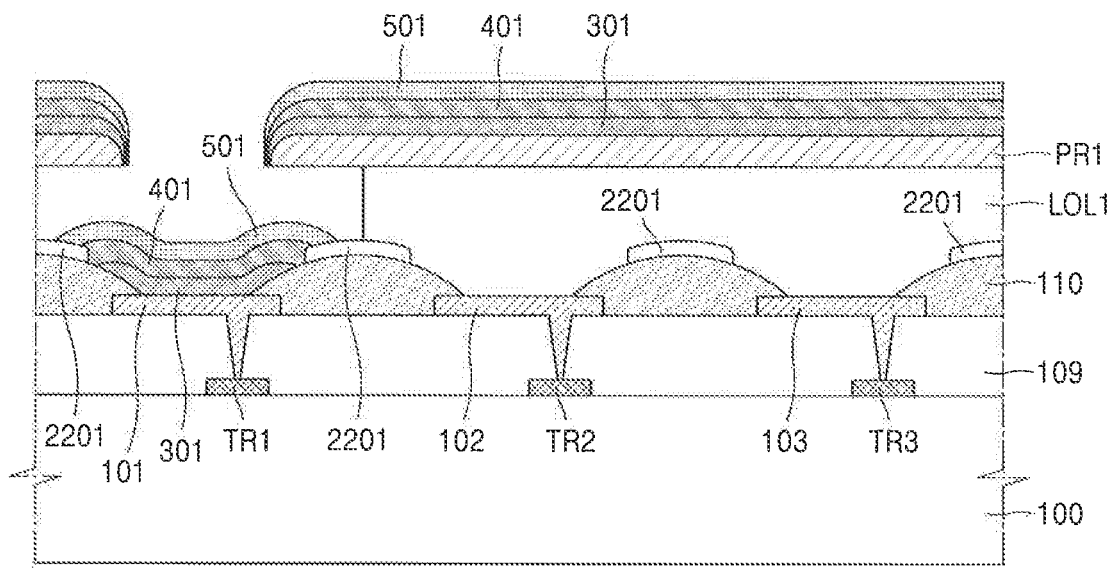

Referring to FIG. 12D, the first intermediate layer 301, the first opposite electrode 401, and the first passivation layer 501 including a first emission layer are formed on the structure of FIG. 12C.

The first intermediate layer 301, the first opposite electrode 401, and the first passivation layer 501 are formed by vacuum deposition. A deposition material discharged from a deposition source is sequentially deposited by controlling a deposition angle of incidence to the substrate 100.

The first intermediate layer 301 is stacked on and in contact with the upper surface of the first pixel electrode 101 and the upper surface of the first insulating film 110. The first opposite electrode 401 covers the first intermediate layer 301 and is connected to a portion of the auxiliary electrode 2201 on the first insulating film 110. The first opposite electrode 401 is also in contact with the upper surface of the first insulating film 110. The first passivation layer 501 is stacked on and in contact with an upper surface of the first opposite electrode 401 and the auxiliary electrode 2201. The first intermediate layer 301, the first opposite electrode 401, and the first passivation layer 501 are also stacked on the first photoresist PR1.

Since the first passivation layer 501 entirely covers the first intermediate layer 301, the first intermediate layer 301 including a first emission layer may be prevented from being damaged by a first solvent used in a lift-off process.

Figure 12E:
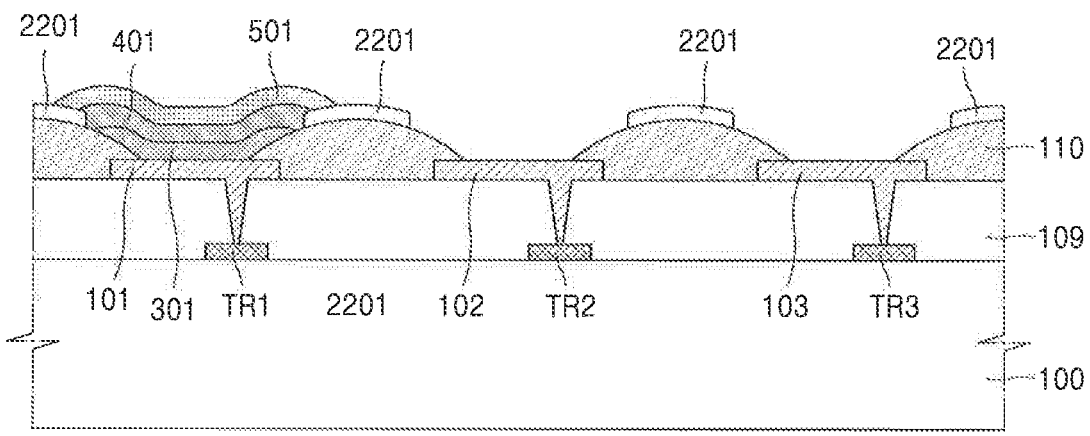

Referring to FIG. 12E, the lift-off process is performed on the structure of FIG. 12D.

When the first lift-off layer LOL1 includes a fluoropolymer, the first lift-off layer LOL1 may be removed using a second solvent including fluorine.

As a result of the lift-off process, the first pixel electrode 101 formed in a first unit process, the first intermediate layer 301 on the first insulating film 110, the first opposite electrode 401 on the first intermediate layer 301 and having an end in contact with the auxiliary electrode 2201, and the first passivation layer 501 covering the first opposite electrode 401 remain as a pattern.

According to the above-described comparative example, since the auxiliary electrode 2201 is deposited on the first to third pixel electrodes 101, 102, and 103 and patterned through a photolithography process using the photomask M0, the first to third pixel electrodes 101, 102, and 103 may be damaged during the patterning process. In addition, the photolithography process is an extra step, and thus, leads to an increase a process time and manufacturing cost.

Hereinafter, the organic light-emitting diode display 2 according to a second exemplary embodiment of the present inventive concept and a method of manufacturing the organic light-emitting diode display 2 will be described with reference to FIGS. 13 to 16E.

Figure 13:
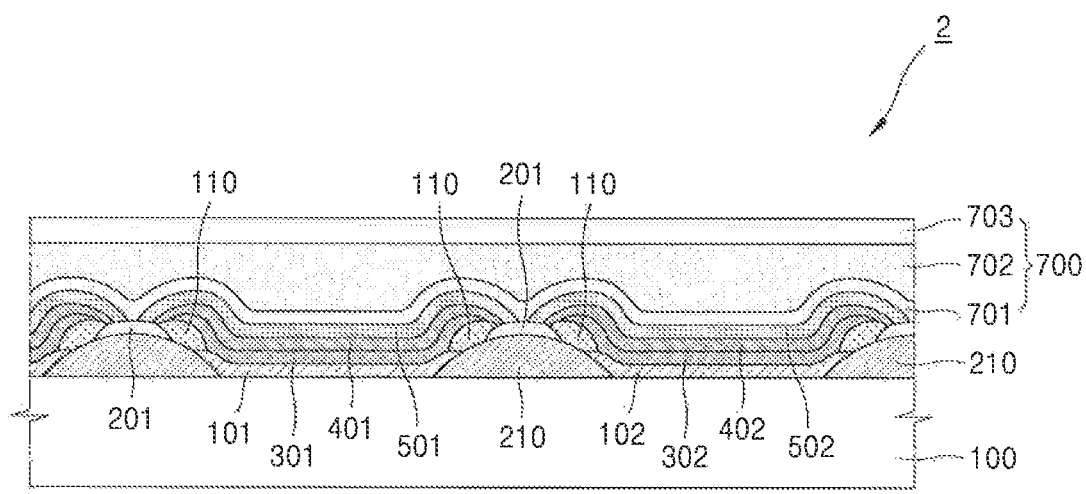
FIG. 13 is a cross-sectional view of an organic light-emitting display device according to a second exemplary embodiment of the present inventive concept.
Figure 14:
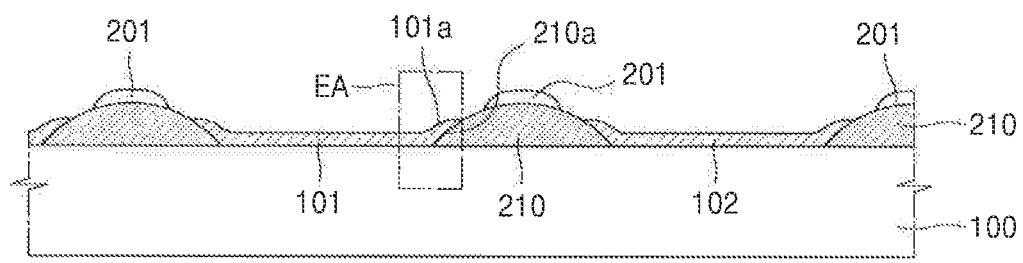
FIGS. 14 and 15 are cross-sectional views of an operation of forming first and second pixel electrodes, an auxiliary electrode, a first insulating film, and a second insulating film on a substrate of the organic light-emitting display device according to the second embodiment.
Figure 15:
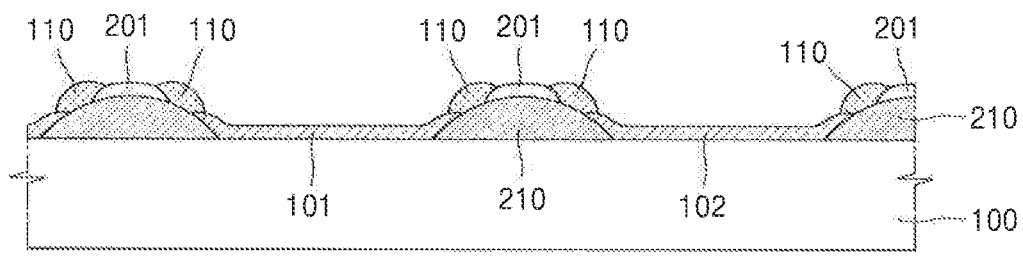

FIG. 13 is a cross-sectional view of the organic light-emitting display device 2 according to the second embodiment, FIGS. 14 and 15 are cross-sectional views of an operation of forming the first and second pixel electrodes 101 and 102, the auxiliary electrode 201, the first insulating film 110, and the second insulating film 210 on the substrate 100 of the organic light-emitting display device 2 according to the second embodiment, and FIGS. 16A to 16E are cross-sectional views of a first unit process of the organic light-emitting display device 2 according to the second embodiment.

Referring to FIG. 13, the organic light-emitting display device 2 according to the second embodiment includes the first and second pixel electrodes 101 and 102 spaced apart from each other on the substrate 100, and the auxiliary electrode 201 between the first and second pixel electrodes 101 and 102, wherein the first insulating film 110 covers the ends of the first and second pixel electrodes 101 and 102 and the end of the auxiliary electrode 201. For example, the first insulating film 110 may contact an end of the auxiliary electrode 201, an end of the second pixel electrode 102 and a portion of the second insulating film 210 disposed therebetween. The first insulating film 110 covers the ends of the first and second pixel electrodes 101 and 102 to prevent an electric field concentration at each of the ends and may function as a pixel-defining layer for defining a light-emitting region.

In the present embodiment, the second insulating film 210 is arranged between the substrate 100 and the auxiliary electrode 201, unlike the first embodiment described above.

The first and second intermediate layers 301 and 302 are arranged on the first and second pixel electrodes 101 and 102 and may include first and second emission layers, respectively.

The first and second opposite electrodes 401 and 402 are arranged on the first and second intermediate layers 301 and 302 to cover the first and second intermediate layers 301 and 302, respectively. The first and second intermediate layers 301 and 302 may not contact the auxiliary electrode 201. The first opposite electrode 401 covers the first intermediate layer 301 and extends to the auxiliary electrode 201 to contact the auxiliary electrode 201, and the second opposite electrode 402 covers the second intermediate layer 302 and extends to the auxiliary electrode 201 to contact the auxiliary electrode 201. The auxiliary electrode 201 is electrically connected to a common power supply voltage, and the common power supply voltage is applied to each of the first and second opposite electrodes 401 and 402 in contact with the auxiliary electrode 201. When a driving current is transmitted from a driving thin-film transistor to the first and second pixel electrodes 101 and 102 and the common power supply voltage is applied to the first and second opposite electrodes 401 and 402 through the auxiliary electrode 201, the first and second emission layers emit light.

The first and second passivation layers 501 and 502 are arranged on the first and second opposite electrodes 401 and 402.

The first passivation layer 501 completely covers the first opposite electrode 401 and extends to the auxiliary electrode 201 so that the end of the first passivation layer 501 contacts an upper surface of the auxiliary electrode 201. The second passivation layer 502 completely covers the second opposite electrode 402 and extends to the auxiliary electrode 201 so that an end of the second passivation layer 502 contacts an upper surface of the auxiliary electrode 201.

The first and second passivation layers 501 and 502 completely cover the first and second intermediate layers 301 and 302 and the first and second opposite electrodes 401 and 402, respectively. As a result, an organic light-emitting device may be prevented from being damaged in a patterning operation.

In the present embodiment, the first and second pixel electrodes 101 and 102 may be spaced apart from each other in an island shape, and the first and second intermediate layers 301 and 302 may also be arranged in an island shape on the first and second pixel electrodes 101 and 102. The first and second passivation layers 501 and 502 covering the first and second opposite electrodes 401 and 402 may also be arranged in an island shape.

The sealing member 700 covering the entire upper surface of the first and second passivation layers 501 and 502 and the auxiliary electrode 201 is arranged on the substrate 100.

The sealing member 700 may include at least one organic layer and at least one inorganic layer. FIG. 2 shows a structure in which the first inorganic layer 701, the organic layer 702, and the second inorganic layer 703 are sequentially stacked.

Referring to FIG. 14, the first and second pixel electrodes 101 and 102 are on the substrate 100 and the second insulating film 210 is between the first and second pixel electrodes 101 and 102. Since an end 101a of the first pixel electrode 101 extends to an upper surface of an end 210a of the second insulating film 210 without being covered by the second insulating film 210, the light-emitting region EA increases.

The auxiliary electrode 201 patterned with a conductive material is on the second insulating film 210. The auxiliary electrode 201 may be formed in a process using the same mask as the first and second pixel electrodes 101 and 102. However, the present inventive concept is not limited thereto. The auxiliary electrode 201 may include materials different from those of the first and second pixel electrodes 101 and 102 and may be formed by a mask process different from that of the first and second pixel electrodes 101 and 102.

Referring to FIG. 15, a first insulating film 110 is formed in a space between the first pixel electrode 101 and the auxiliary electrode 201, and a space between the second pixel electrode 102 and the auxiliary electrode 201. The first insulating film 110 covers the ends of the first and second pixel electrodes 101 and 102 and the end of the auxiliary electrode 201. The first insulating film 110 covers the ends of the first and second pixel electrodes 101 and 102 to prevent an electric field concentration at each of the ends and may function as a pixel-defining layer for defining a light-emitting region.

The first insulating film 110 and the second insulating film 210 may include an organic insulating material or an inorganic insulating material.

Figure 16A:
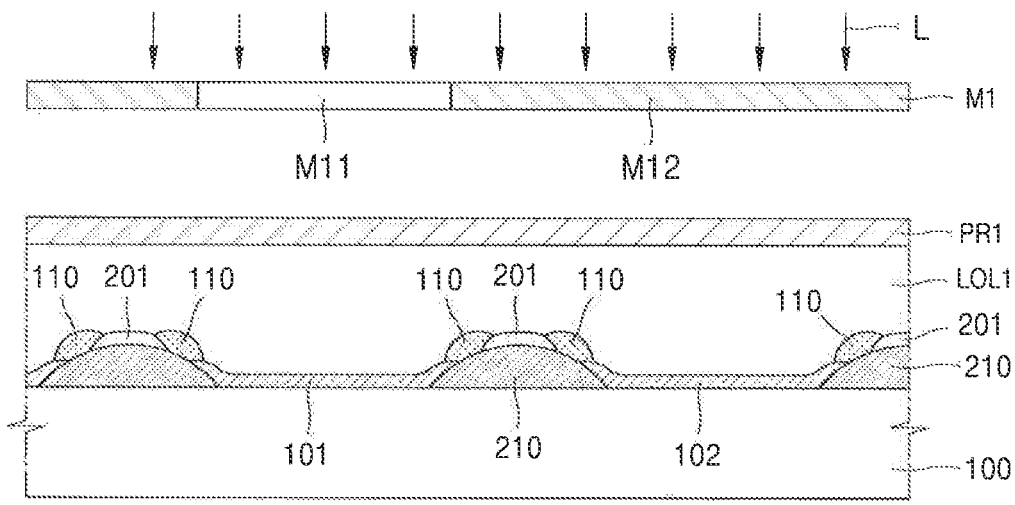
FIGS. 16A, 16B, 16C, 16D and 16E are cross-sectional views of a first unit process of the organic light-emitting display device according to the second embodiment.

Referring to FIG. 16A, the first lift-off layer LOL1 and the first photoresist PR1 are sequentially formed on the structure of FIG. 15.

The first lift-off layer LOLA may include a non-photosensitive organic material. The first lift-off layer LOLA may include a fluoropolymer. The fluoropolymer included in the first lift-off layer LOL1 may be formed of a polymer including about 20 to about 60 wt % of fluorine content. For example, a fluoropolymer included in the first lift-off layer LOL1 may include polytetrafluoroethylene, polychlorotrifluoroethylene, polydichlorodifluoroethylene, a copolymer of chlorotrifluoroethylene and dichlorodifluoroethylene, a copolymer of tetrafluoroethylene and perfluoroalkyl vinylether, a copolymer of chlorotrifluoroethylene and perfluoroalkyl vinylether, a copolymer of tetrafluoroethylene and perfluoroalkyl vinylether, a copolymer of perfluoroalkyl vinylether and perfluoroalkyl vinylether, a copolymer of tetrafluoroethylene and perfluoroalkyl vinylether, or a copolymer of chlorotrifluoroethylene and perfluoroalkyl vinylether. The first lift-off layer LOL1 may be formed by a coating method, a printing method, a vapor deposition method, or the like.

The first photoresist PR1 is formed on the first lift-off layer LOL1. The first photoresist PR1 at a position corresponding to the first pixel electrode 101 is exposed through a first photomask M1 including a light-transmitting portion M11 and a light-blocking portion M12.

Figure 16B:
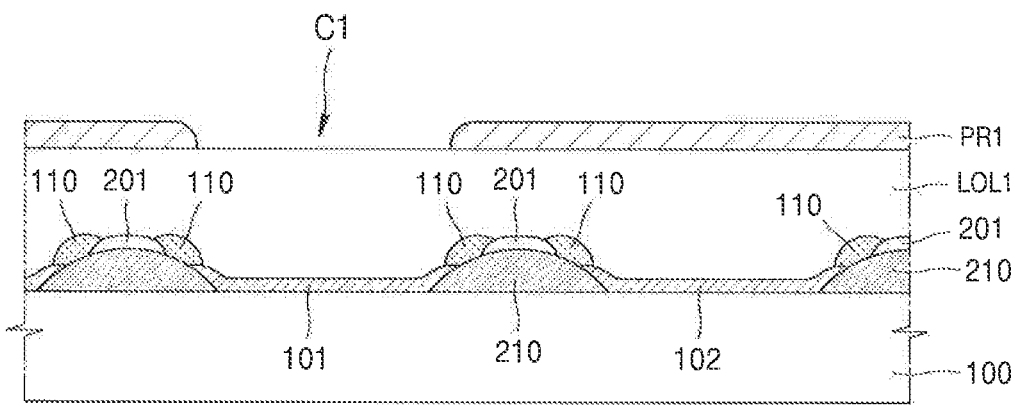

Referring to FIG. 16B, the first photoresist PR1 is developed. The developed first photoresist PR1 has the first opening C1 at a portion corresponding to the first pixel electrode 101.

Figure 16C:
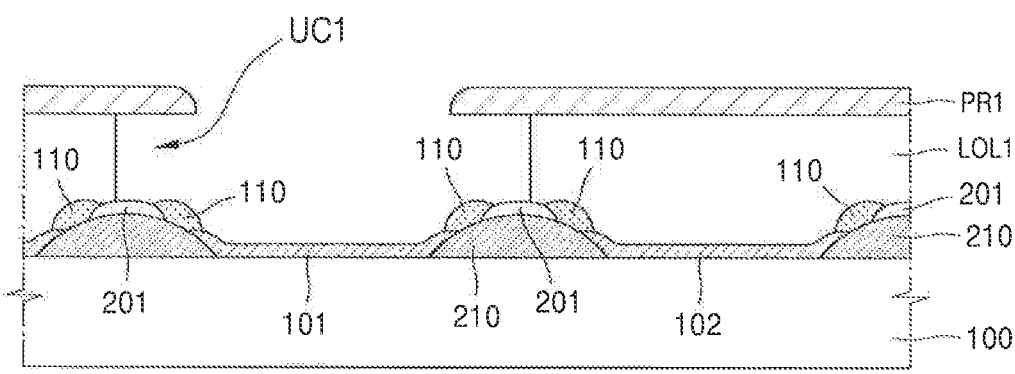

Referring to FIG. 16C, the first lift-off layer LOL1 is etched using the patterned first photoresist PR1 of FIG. 16B as an etching mask.

When the first lift-off layer LOL1 includes a fluoropolymer, an etchant uses a solvent capable of etching the fluoropolymer. A first solvent may include hydrofluoroether. The hydrofluoroether is an electrochemically stable material with low interaction with other materials, and is environmentally stable because of its low global warming potential and low toxicity.

Upon etching the first lift-off layer LOL1 by an etching process, the first solvent including fluorine forms the first undercut profile UC1 below the first opening C1 of the first photoresist PR1.

Figure 16D:
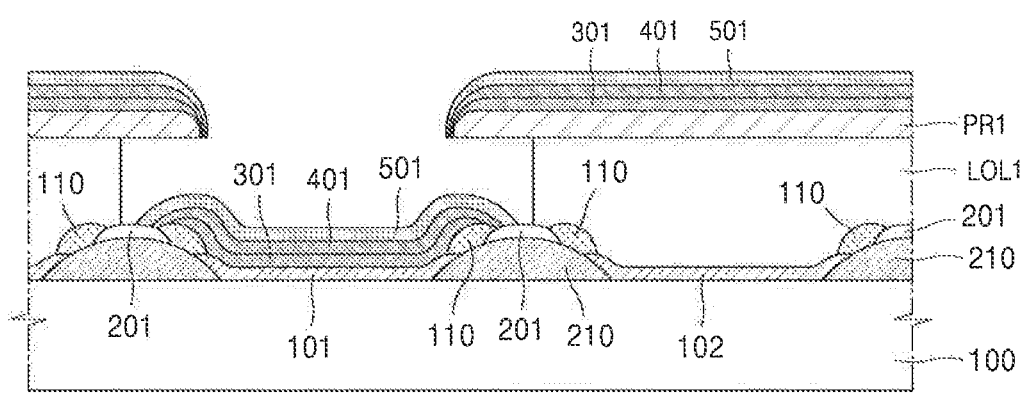

Referring to FIG. 16D, the first intermediate layer 301, the first opposite electrode 401, and the first passivation layer 501 including a first emission layer are formed on the structure of FIG. 16C. The first intermediate layer 301 may be formed to further include a hole injection layer, a hole transport layer, an electron transport layer, or an electron injection layer.

The first intermediate layer 301, the first opposite electrode 401, and the first passivation layer 501 are formed by vacuum deposition. A deposition material discharged from a deposition source is sequentially deposited by controlling a deposition angle of incidence to the substrate 100.

The first intermediate layer 301 is stacked on the upper surface of the first pixel electrode 101 and the upper surface of the first insulating film 110. The first opposite electrode 401 is stacked on and in contact with the upper surface of the first intermediate layer 301, the first insulating film 110, and the auxiliary electrode 201. The first passivation layer 501 is stacked on and in contact with an upper surface of the first opposite electrode 401 and the auxiliary electrode 201. The first passivation layer 501 may not contact the first insulating film 110. The first intermediate layer 301, the first opposite electrode 401, and the first passivation layer 501 are also stacked on the first photoresist PR1.

The first lift-off layer LOL1 may include a non-photosensitive organic material. The first lift-off layer LOL1 may include a fluoropolymer. The fluoropolymer included in the first lift-off layer LOL1 may be formed of a polymer including about 20 to about 60 wt % of fluorine content.

Since the first passivation layer 501 entirely covers the first intermediate layer 301, the first intermediate layer 301 including a first emission layer may be prevented from being damaged by a first solvent used in a lift-off process of a subsequent second unit process.

Figure 16E:
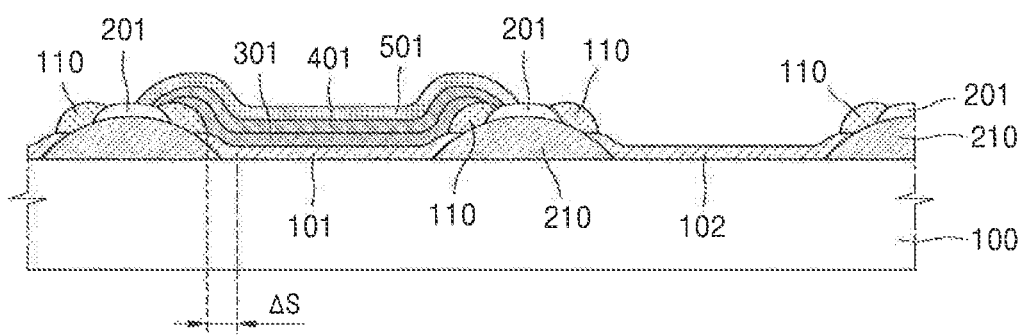

Referring to FIG. 16E, the lift-off process is performed on the structure of FIG. 16D.

As a result of the lift-off process, the first intermediate layer 301, the first opposite electrode 401, and the first passivation layer 501 arranged on the first pixel electrode 101, the first insulating film 110, and the auxiliary electrode 201 remain as a pattern.

Compared with the first embodiment described above, since an end of the first pixel electrode 101 extends to an upper surface of an end of the second insulating film 210 without being covered by the second insulating film 210, the area of a light-emitting region increases by ΔS. In other words, the ends of the first pixel electrode 101 and the second insulating film 210 may overlap each other so as to include the area of a light-emitting region. Similarly, the ends of the second pixel electrode 102 and the second insulating film 210 may overlap each other so as to include the area of a light-emitting region.

In the present embodiment as in the first embodiment described above, an intermediate layer, an opposite electrode, and a passivation layer are formed in the second pixel electrode 102 and a third pixel electrode by performing second and third unit processes. Therefore, a full-color organic light-emitting display device may be manufactured. Since the present embodiment is similar to the above-described first embodiment, repeated descriptions thereof will not be given herein.

In the organic light-emitting display device 2 and the method of manufacturing the organic light-emitting display device 2 according to the second embodiment, since an auxiliary electrode is formed in the same process as that of a pixel electrode, it is possible to prevent the pixel electrode from being damaged by forming the auxiliary electrode without performing an additional photomask process. Further, there is an effect that the area of a light-emitting region is increased.

According to the exemplary embodiments of the present inventive concept, since an intermediate layer including an emission layer is formed by a lift-off process instead of deposition using a fine metal mask, a misalignment of the fine metal mask may be prevented and a manufacturing cost may be reduced.

Furthermore, according to the exemplary embodiments of the present inventive concept, since an auxiliary electrode is formed in the same process as that of a pixel electrode, it is possible to prevent the pixel electrode from being damaged by forming the auxiliary electrode without performing an additional photomask process.

Further, according to the exemplary embodiments of the present inventive concept, there is an effect that the area of a light-emitting region is increased by interposing an additional insulating film between a substrate and an auxiliary electrode.

However, the present inventive concept is not limited to these effects.

While the present inventive concept has been described with reference to exemplary embodiments thereof, it will be understood by those of ordinary skill in the art that various changes in form and details may be made thereto without departing from the spirit and scope of the present inventive concept as defined by the following claims.

What is claimed is:

1. An organic light-emitting display device, comprising:
a substrate;
a pixel electrode on the substrate;
an auxiliary electrode spaced apart from the pixel electrode;
a first insulating film between the pixel electrode and the auxiliary electrode and covering an end of the pixel electrode and an end of the auxiliary electrode;
an intermediate layer on the pixel electrode, wherein the intermediate layer comprises an emission layer;
an opposite electrode covering the intermediate layer and contacting the auxiliary electrode;
a passivation layer covering the opposite electrode and in contact with the auxiliary electrode; and
a sealing member on the passivation layer, wherein the sealing member comprises an organic layer or an inorganic layer contacting the auxiliary electrode.

2. The organic light-emitting; display device of claim 1, wherein the auxiliary electrode surrounds the pixel electrode.

3. The organic light-emitting display device of claim 1, wherein the auxiliary electrode comprises the same material as the pixel electrode.

4. The organic light-emitting display device of claim 1, wherein the first insulating film surrounds the pixel electrode.

5. The organic light-emitting display device of claim 1, wherein the intermediate layer further comprises a hole injection layer, a hole transport layer, an electron transport layer, or an electron injection layer.

6. The organic light-emitting display device of claim 1, wherein an end of the opposite electrode is in contact with an upper surface of the auxiliary electrode.

7. The organic light-emitting display device of claim 1, wherein an end of the passivation layer contacts an upper surface of the auxiliary electrode.

8. The organic light-emitting display device of claim 7, wherein the passivation layer is island-shaped.

9. The organic light-emitting display device of claim 1, wherein the passivation layer comprises oxide, oxynitride, or nitride.

10. The organic light-emitting display device of claim 1, further comprising:

a second insulating film between the auxiliary electrode and the substrate.

11. The organic light-emitting display device of claim 10, wherein the auxiliary electrode and the first insulating film are on the second insulating film.

12. The organic light-emitting display device of claim 10, wherein the end of the pixel electrode is on the second insulating film.

13. The organic light-emitting display device of claim 10, wherein the first insulating film surrounds the pixel electrode on the second insulating film.

14. An organic light-emitting display device, comprising:
a substrate;
first and second pixel electrodes on the substrate;
an auxiliary electrode, which surrounds the first and second pixel electrodes, wherein the auxiliary electrode is spaced apart from the first and second pixel electrodes;
a first insulating film between the first pixel electrode and the auxiliary electrode and covering an end of the first pixel electrode and a first end of the auxiliary electrode;
a second insulating film, between the second pixel electrode and the auxiliary electrode and covering an end of the second pixel electrode and a second end of the auxiliary electrode;
a first intermediate layer comprising a first emission layer and arranged on the first pixel electrode;
a second intermediate layer comprising a second emission layer and arranged on, the second pixel electrode;
a first opposite electrode covering the first intermediate layer and contacting the auxiliary electrode;
a second opposite electrode covering the second intermediate layer and contacting the auxiliary electrode;
a first passivation layer covering the first opposite electrode;
a second passivation layer covering the second opposite electrode; and
a sealing member arranged on the first passivation layer and the second passivation layer and comprising an organic layer or an inorganic layer extending along a surface of the auxiliary electrode.

15. The organic light-emitting display device of claim 14, wherein the first and second pixel electrodes comprise the same material as the auxiliary electrode.

16. The organic light-emitting display device of claim 14, wherein the first and second insulating films respectively surround the first and second pixel electrodes.

17. The organic light-emitting display device of claim 14, further comprising:
a third insulating film between the first and second pixel electrodes and the substrate.

18. The organic light-emitting display device of claim 17, wherein the first and second pixel electrodes are on the third insulating film.

19. A light-emitting display device, comprising:
a substrate;
a pixel electrode on the substrate;
an auxiliary electrode on the substrate;
an insulating film between the pixel electrode and the auxiliary electrode and overlapping the pixel electrode and the auxiliary electrode;
an intermediate layer overlapping the pixel electrode and the insulating film;
an opposite electrode covering the intermediate layer and contacting the auxiliary electrode;
a pass nation layer covering the opposite electrode and contacting the auxiliary electrode; and
a sealing member in direct contact with the auxiliary electrode.

\* \* \* \* \*